US012057365B2

United States Patent
Kanda

(10) Patent No.: US 12,057,365 B2
(45) Date of Patent: Aug. 6, 2024

(54) SEMICONDUCTOR DEVICE

(71) Applicant: ROHM CO., LTD., Kyoto (JP)

(72) Inventor: Takumi Kanda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 524 days.

(21) Appl. No.: 17/419,025

(22) PCT Filed: Jan. 10, 2020

(86) PCT No.: PCT/JP2020/000612
§ 371 (c)(1),
(2) Date: Jun. 28, 2021

(87) PCT Pub. No.: WO2020/149225
PCT Pub. Date: Jul. 23, 2020

(65) Prior Publication Data
US 2022/0084900 A1    Mar. 17, 2022

(30) Foreign Application Priority Data
Jan. 16, 2019    (JP) .................................. 2019-004916

(51) Int. Cl.
*H01L 23/367*    (2006.01)
*H01L 23/00*    (2006.01)
(Continued)

(52) U.S. Cl.
CPC ...... *H01L 23/367* (2013.01); *H01L 23/49838* (2013.01); *H01L 23/49861* (2013.01);
(Continued)

(58) Field of Classification Search
CPC ............. H01L 23/367; H01L 23/49838; H01L 23/49861; H01L 23/3121; H01L 25/072;
(Continued)

(56) References Cited

U.S. PATENT DOCUMENTS

2015/0327360 A1    11/2015  Knorr et al.
2015/0340350 A1*   11/2015  Koga .................. H01L 23/3735
                                                      257/713
2022/0084900 A1*    3/2022  Kanda ............... H01L 23/49562

FOREIGN PATENT DOCUMENTS

EP    2 284 883 A1    2/2011
EP    2284883 A1  *   2/2011    ......... H01L 23/3735
(Continued)

OTHER PUBLICATIONS

Office Action received in the corresponding Japanese Patent application, Jun. 6, 2023, and machine translation (8 pages).
(Continued)

*Primary Examiner* — Marc Anthony Armand
(74) *Attorney, Agent, or Firm* — HSML P.C.

(57) ABSTRACT

A semiconductor device includes an insulating substrate, wiring layers, heat dissipation layers, a semiconductor element, and a sealing resin. The wiring layers each have a first obverse face and a first reverse face oriented in opposite directions in a thickness direction of the substrate. The first reverse faces of the wiring layers are connected to the substrate. The heat dissipation layers each have a second obverse face oriented in the same direction as the first obverse face, and a second reverse face oriented opposite to the second obverse face in the thickness direction. The heat dissipation layers are located opposite to the plurality of wiring layers in the thickness direction with respect to the substrate. The second obverse faces of the heat dissipation layers are connected to the substrate. The semiconductor element is connected to one of the first obverse faces of the wiring layers. The sealing resin covers the substrate, the wiring layers, and the semiconductor element. As viewed in the thickness direction, the wiring layers overlap with the heat dissipation layers, respectively.

19 Claims, 25 Drawing Sheets

(51) Int. Cl.
*H01L 23/31* (2006.01)
*H01L 23/498* (2006.01)
*H01L 25/07* (2006.01)

(52) U.S. Cl.
CPC ........ *H01L 25/072* (2013.01); *H01L 23/3121* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/29111* (2013.01); *H01L 2224/32225* (2013.01); *H01L 2224/45124* (2013.01); *H01L 2224/48225* (2013.01); *H01L 2224/73265* (2013.01)

(58) Field of Classification Search
CPC ......... H01L 24/29; H01L 24/32; H01L 24/45; H01L 24/48; H01L 24/73
See application file for complete search history.

(56) References Cited

FOREIGN PATENT DOCUMENTS

| | | | | |
|---|---|---|---|---|
| JP | 200331718 | * | 7/2001 | ............. H01L 23/12 |
| JP | 2001-332823 | A | 11/2001 | |
| JP | 2002-343911 | A | 11/2002 | |
| JP | 2003-31718 | A | 1/2003 | |
| JP | 2003-100966 | A | 4/2003 | |
| JP | 2009-158787 | A | 7/2009 | |
| WO | 2009/131217 | A1 | 10/2009 | |

OTHER PUBLICATIONS

International Search Report issued in PCT/JP2020/000612, Mar. 24, 2020 (2 pages).
Office Action received in the corresponding Chinese Patent application, May 17, 2023, and machine translation (14 pages).

* cited by examiner

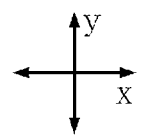
FIG.18
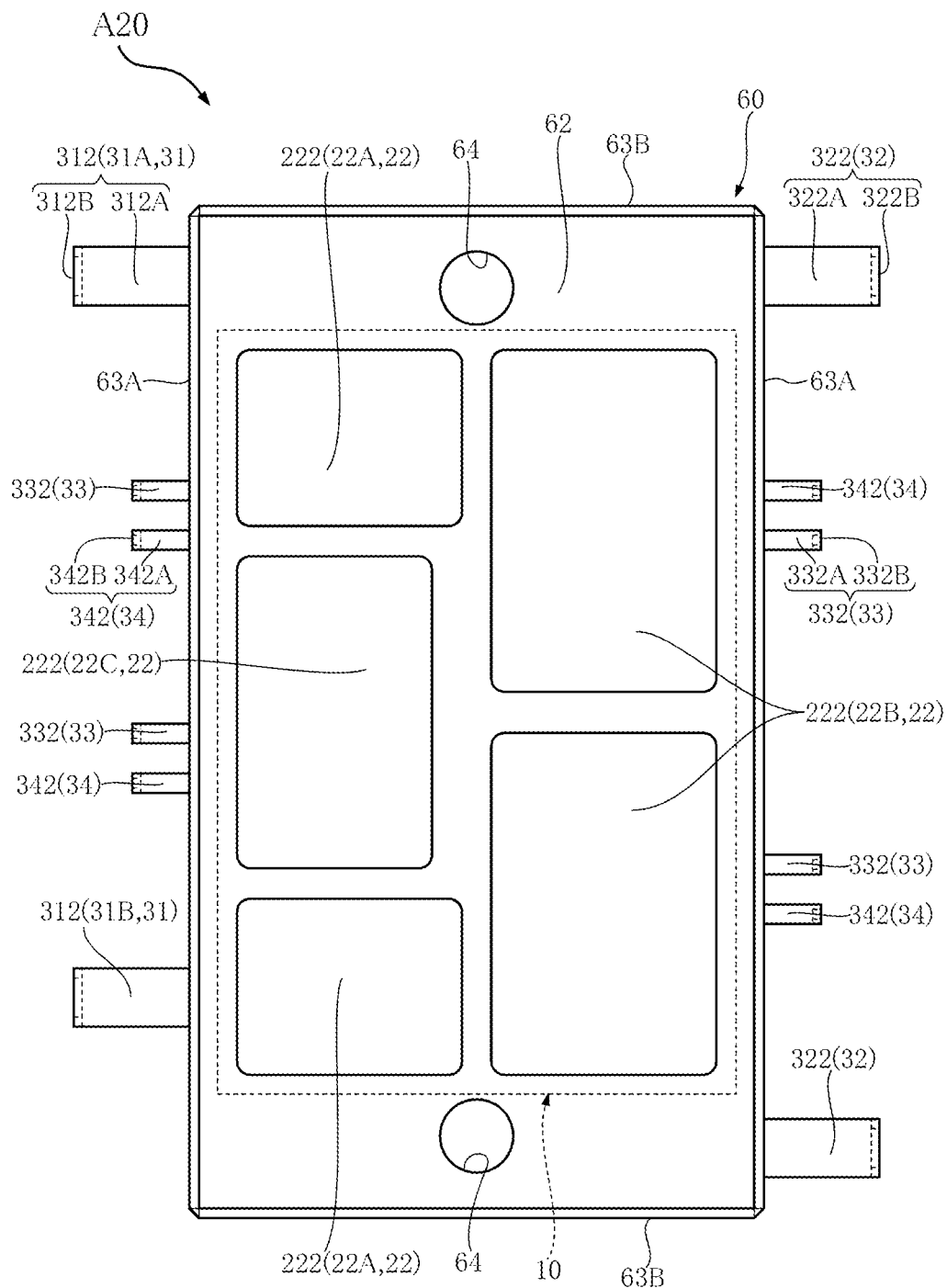

SEMICONDUCTOR DEVICE

TECHNICAL FIELD

The present disclosure relates to a semiconductor device provided with semiconductor elements, and in particular to a semiconductor device in which the semiconductor elements are switching elements.

BACKGROUND ART

Semiconductor devices, with semiconductor elements such as a MOSFET and an IGBT mounted thereon, are widely known. Patent Literature 1 discloses an example of the semiconductor device on which such semiconductor elements are mounted. In this semiconductor device, a plurality of wiring layers (metal patterns 4a and 4b in Patent Literature 1) are provided on a front face of an insulating substrate, and a heat dissipation layer (metal pattern 4c Patent Literature 1) is provided on a back face of the insulating substrate. The heat dissipation layer is provided over the entire back face of the insulating substrate. Accordingly, the heat dissipation layer is larger in volume, than the plurality of wiring layers. Therefore, at a certain temperature, the thermal expansion volume of the heat dissipation layer is larger than that of the overall thermal expansion volume of the plurality of wiring layers. Here, a semiconductor element (IGBT in Patent Literature 1) is connected to the plurality of wiring layer.

Regarding such a semiconductor device, increasing the thickness of both of the plurality of wiring layers and the heat dissipation layer is being studied, to improve the heat dissipation performance. Applying such a remedy to the semiconductor device, however, can lead to further increase in thermal expansion volume difference between the wiring layers and the heat dissipation layer, thereby rendering more prominent the distortion of the insulating substrate, which may arise from the heat applied to the insulating substrate, for example, during the manufacturing process of the semiconductor device (mainly bonding process of the semiconductor element and formation process of a sealing resin) or during the use of the semiconductor device. The larger extent of the distortion of the insulating substrate may negatively affect the productivity of the semiconductor device, as well as the reliability of the semiconductor device in use, and therefore there is room for improvement in these aspects.

PRIOR ART DOCUMENTS

Patent Document

Patent Document 1: JP-A-2009-158787

SUMMARY OF THE INVENTION

Problems to be Solved by the Invention

In view of the foregoing situation, an object of the present disclosure is to provide a semiconductor device configured to suppress the distortion of the insulating substrate, without compromising the heat dissipation performance.

Means for Solving the Problem

In an aspect, the present disclosure provides a semiconductor device comprising: an insulating substrate; a plurality of wiring layers each having a first obverse face and a first reverse face oriented in opposite directions to each other in a thickness direction, where the first reverse face is connected to the insulating substrate; a plurality of heat dissipation layers each having a second obverse face oriented in a same direction as the first obverse face and a second reverse face oriented in an opposite direction to the second obverse face in the thickness direction, and each being located on an opposite side of the plurality of wiring layers in the thickness direction with respect to the insulating substrate, where the second obverse face is connected to the insulating substrate; a semiconductor element connected to one of the first obverse faces of the plurality of wiring layers; and a sealing resin covering the insulating substrate, the plurality of wiring layers, and the semiconductor element. As viewed in the thickness direction, the plurality of wiring layers overlap with the plurality of heat dissipation layers, respectively.

Other features and advantages of the present disclosure will become more apparent, through the detailed description given hereunder with reference to the accompanying drawings.

BRIEF DESCRIPTION OF THE DRAWINGS

FIG. 18 is a bottom view of the semiconductor device shown in FIG. 17.

MODE FOR CARRYING OUT THE INVENTION

Hereafter, embodiments of the present disclosure will be described with reference to the accompanying drawings.

First Embodiment

Figure 2:
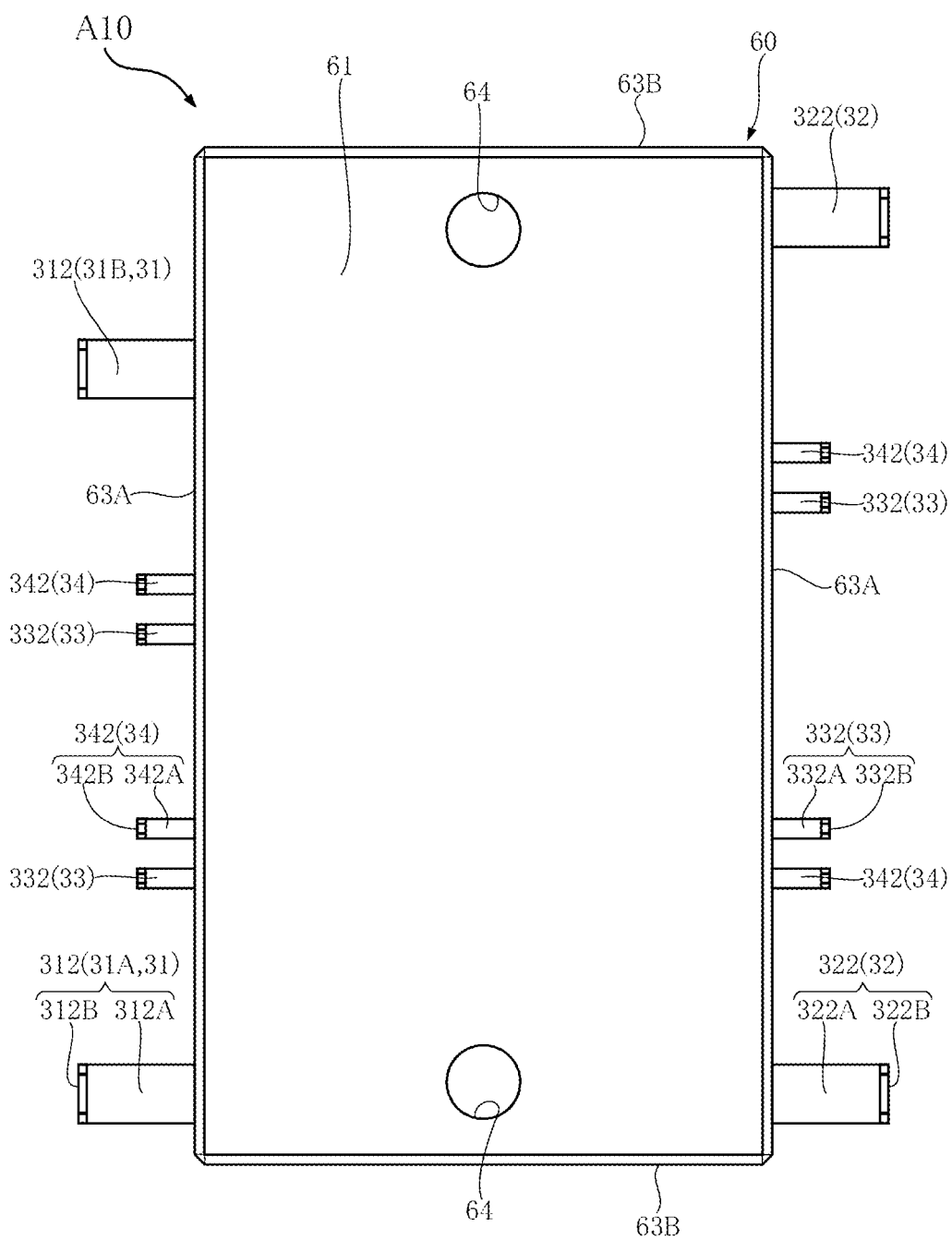
FIG. 2 is a plan view of the semiconductor device shown in FIG. 1.
Figure 3:
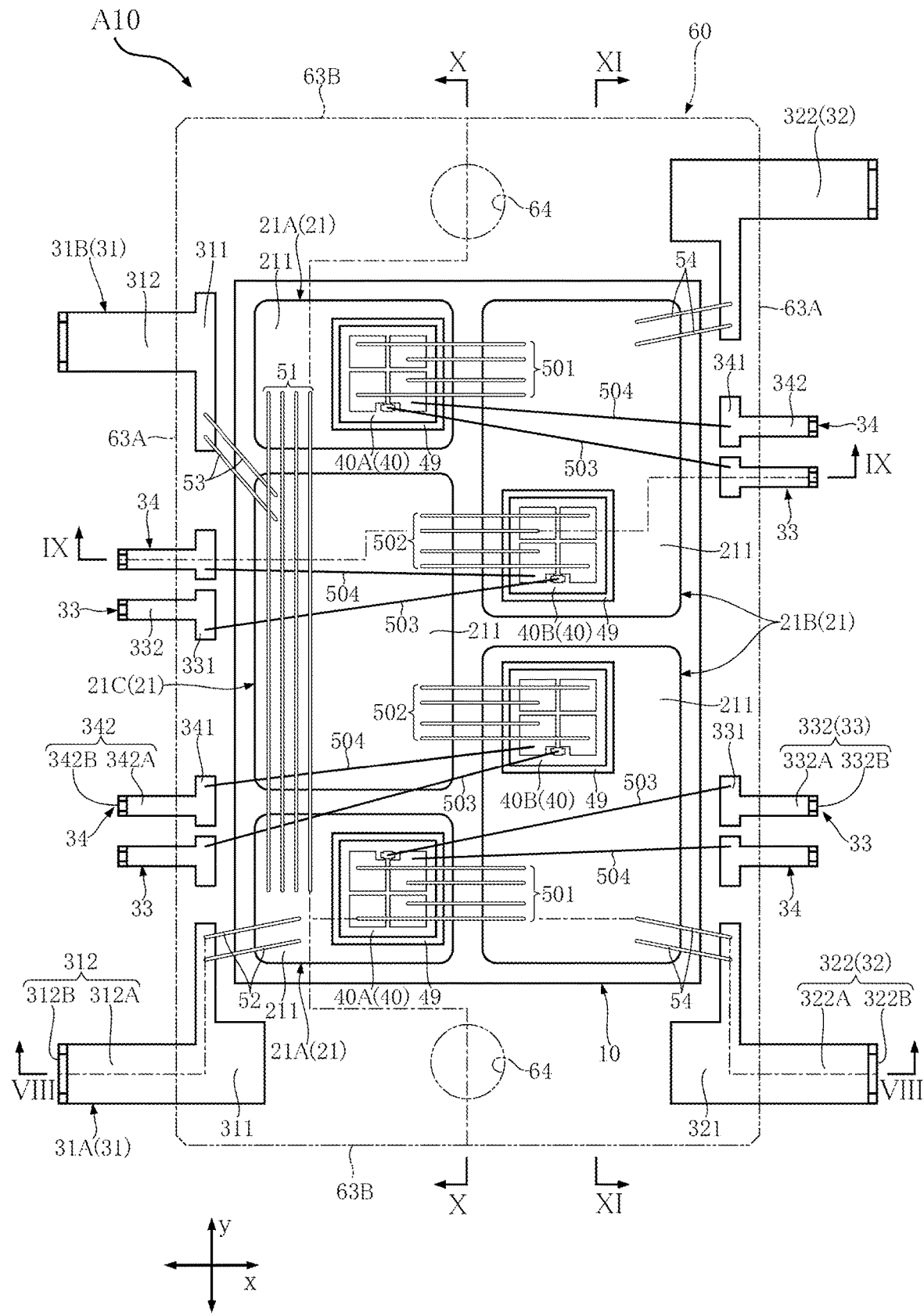
FIG. 3 is a plan view of the semiconductor device shown in FIG. 1, seen through a sealing resin.

Referring to FIG. 1 to FIG. 13, a semiconductor device A10 according to a first embodiment of the present disclosure will be described. The semiconductor device A10 includes an insulating substrate 10, a plurality of wiring layers 21, a plurality of heat dissipation layers 22, a pair of input terminals 31, a pair of output terminals 32, a plurality of gate terminals 33, a plurality of detection terminals 34, a plurality of semiconductor elements 40, and a sealing resin 60. In addition to these, the semiconductor device A10 also includes a plurality of first wires 501, a plurality of second wires 502, a plurality of gate wires 503, a plurality of detection wires 504, a first conductive material 51, a second conductive material 52, a third conductive material 53, and a pair of fourth conductive materials 54. The semiconductor device A10 shown in the cited drawings is a power module in which the plurality of semiconductor elements 40 are, for example, a metal-oxide-semiconductor field-effect transistor (MOSFET). The semiconductor device A10 may be employed as a drive source of a motor, an inverter of various electrical appliances, a DC/DC converter, and so forth. In FIG. 3, the sealing resin 60 is seen through for the sake of clarity, the sealing resin 60 seen through being indicated by an imaginary line (dash-dot-dot line). In FIG. 3, a line VIII-VIII, a line IX-IX, and a line X-X are each indicated by a dash-dot line.

Figure 1:
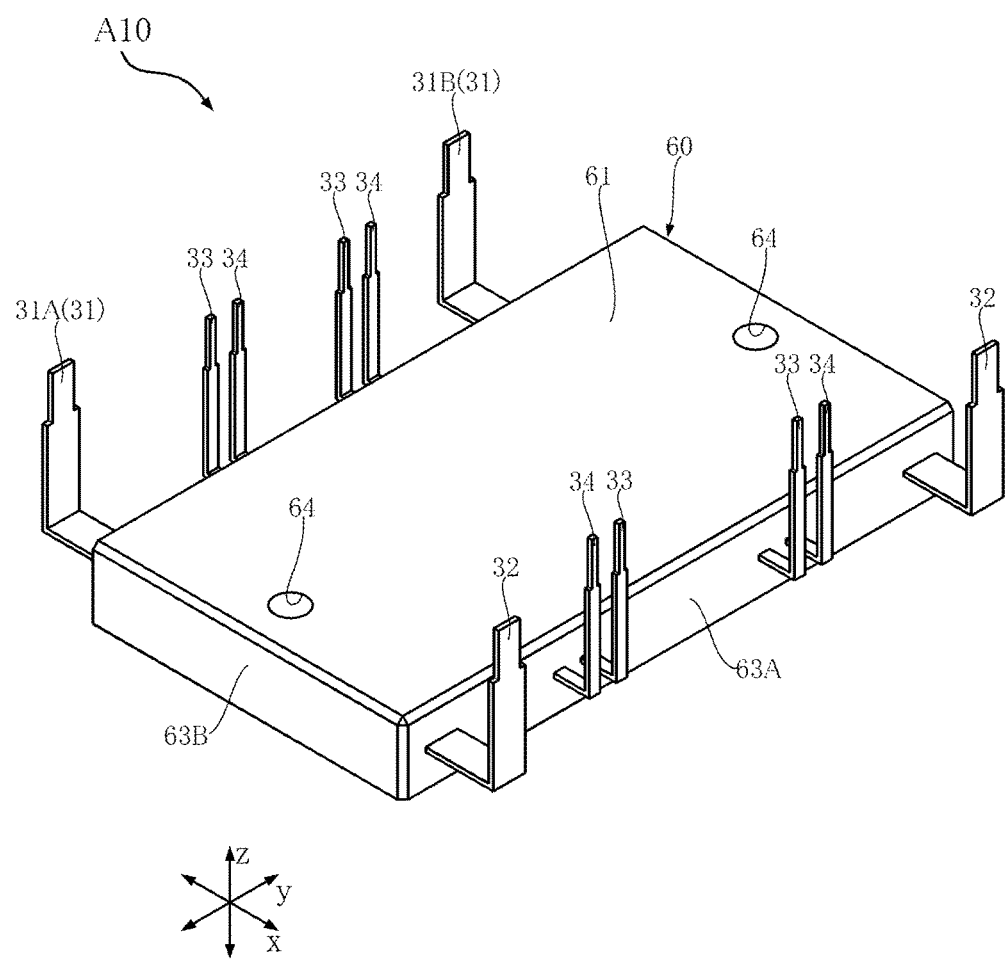
FIG. 1 is a perspective view showing a semiconductor device according to a first embodiment of the present disclosure.

In the description of the semiconductor device A10, for convenience sake, a thickness direction of the insulating substrate 10 will be referred to as "thickness direction z". A direction orthogonal to the thickness direction z will be referred to as "first direction x". A direction orthogonal to both of the thickness direction z and the first direction x will be referred to as "second direction y". As shown in FIG. 1 and FIG. 2, the semiconductor device A10 has a rectangular shape, as viewed in the thickness direction z. The first direction x corresponds to the width direction of the semiconductor device A10. The second direction y corresponds to the longitudinal direction of the semiconductor device A10. In the description of the semiconductor device A10, for convenience sake, the side on which the pair of input terminals 31 are located in the first direction x will be referred to as "one side in the first direction x". The side on which the pair of output terminals 32 are located in the first direction x will be referred to as "the other side in the first direction x". It should be noted that "thickness direction z", "first direction x", "second direction y", "one side in the first direction x", and "the other side in the first direction x" will equally be applied to a semiconductor device A20 and a semiconductor device A30, which will be subsequently described.

As shown in FIG. 8 to FIG. 11, the plurality of wiring layers 21 and the plurality of heat dissipation layers 22 are bonded to the insulating substrate 10. It is preferable that the insulating substrate 10 is formed of a material relatively high in thermal conductivity. In the example represented by the semiconductor device A10, the insulating substrate 10 is a ceramic containing silicon nitride ($Si_3N_4$). Alternatively, the insulating substrate 10 may be, for example, a ceramic containing aluminum nitride (AlN). The insulating substrate 10 is covered with the sealing resin 60.

Figure 13:
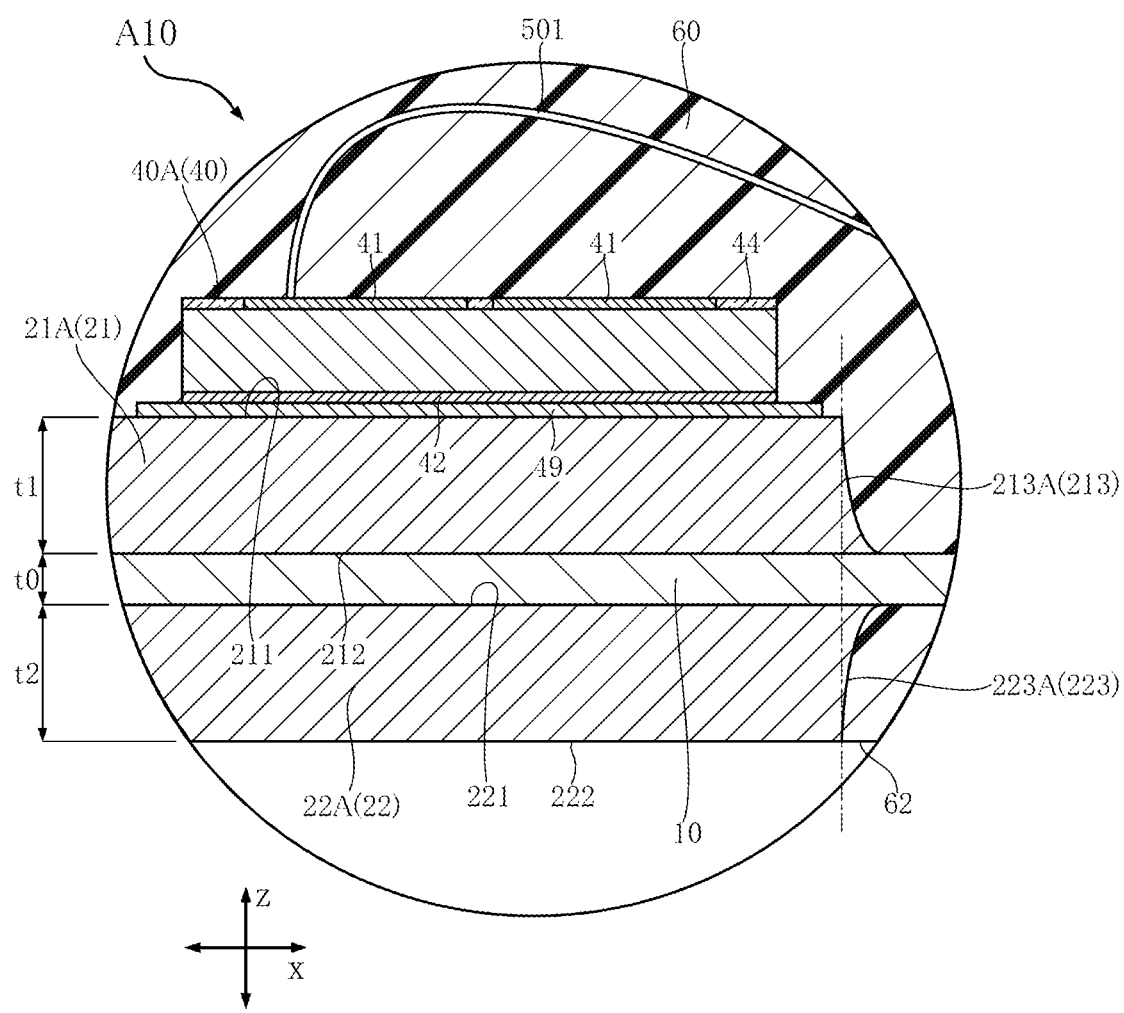
FIG. 13 is a cross-sectional view taken along a line XIII-XIII in FIG. 12.

The plurality of wiring layers 21 are, as shown in FIG. 8 to FIG. 11, each bonded to a face of the insulating substrate 10 in the thickness direction z. The plurality of wiring layers 21 constitute a conductive path between outside of the semiconductor device A10 and the plurality of semiconductor elements 40, in collaboration with the pair of input terminals 31, the pair of output terminals 32, the first conductive material 51, the second conductive material 52, the third conductive material 53, and the pair of fourth conductive materials 54 shown in FIG. 3. The plurality of wiring layers 21 are metal layers containing copper (Cu). A thickness t1 of each of the plurality of wiring layers 21 shown in FIG. 13 is thicker than a thickness t0 of the insulating substrate 10. The thickness t1 is, for example, 0.8 mm or thicker. The respective surfaces of the plurality of wiring layers 21 may be plated with silver (Ag), or with aluminum (Al), nickel (Ni), and silver stacked in this order. As viewed in the thickness direction z, the plurality of wiring layers 21 are all located on the inner side of the peripheral edge of the insulating substrate 10. The plurality of wiring layers 21 are all covered with the sealing resin 60.

As shown in FIG. 8 to FIG. 11, the plurality of wiring layers 21 each include a first obverse face 211, a first reverse face 212, and a plurality of first end faces 213. The first obverse face 211 and the first reverse face 212 are oriented in opposite directions to each other, in the thickness direction z. Out of these faces, the first reverse face 212 is bonded to the insulating substrate 10. The plurality of first end faces 213 are connected to both of the first obverse face 211 and the first reverse face 212, and oriented in a direction orthogonal to the thickness direction z. The plurality of first end faces 213 include a pair of first faces 213A and a pair of third faces 213B. The pair of first faces 213A are spaced apart from each other in the first direction x. The pair of third faces 213B are spaced apart from each other in the second direction y.

As shown in FIG. 8 to FIG. 11, the pair of first faces 213A and the pair of third faces 213B are each formed as an inwardly recessed, concave surface on the corresponding one of the plurality of wiring layers 21. In one of the plurality of wiring layers 21, the pair of first faces 213A and the pair of third faces 213B are each formed in a tapered shape, so as to gradually expand outward from the first obverse face 211 toward the first reverse face 212, in the thickness direction z. Accordingly, in each of the plurality of wiring layers 21, the first obverse face 211 is smaller in area than the first reverse face 212. The mentioned shape of each of the pair of first faces 213A and the pair of third faces 213B is a result of a wet etching process performed to form the plurality of wiring layers 21, from the metal layer bonded to the insulating substrate 10.

In the example represented by the semiconductor device A10, as shown in FIG. 3, the plurality of wiring layers 21 include a pair of first wiring layers 21A, a pair of second wiring layers 21B, and a third wiring layer 21C. However, the configuration of the plurality of wiring layers 21 is not limited to this embodiment, but may be designed as desired, depending on the number of semiconductor elements 40 and the layout thereof.

As shown in FIG. 3, the pair of first wiring layers 21A are located on one side in the first direction x, on the insulating substrate 10. The pair of first wiring layers 21A are spaced apart from each other in the second direction y. The pair of second wiring layers 21B are located on the other side in the first direction x, on the insulating substrate 10. The pair of second wiring layers 21B are spaced apart from each other in the second direction y. The pair of second wiring layers 21B are located adjacent to the pair of first wiring layers 21A, in the first direction x. The third wiring layer 21C is located on one side in the first direction x on the insulating substrate 10, and between the pair of first wiring layers 21A.

The plurality of heat dissipation layers 22 are, as shown in FIG. 8 to FIG. 11, each bonded to the other face of the insulating substrate 10, in the thickness direction z. In other words, the plurality of heat dissipation layers 22 are located on the opposite side of the plurality of wiring layers 21 in the thickness direction z, with respect to the insulating substrate 10. The plurality of heat dissipation layers 22 are metal layers containing copper. A thickness t2 of each of the plurality of heat dissipation layers 22 shown in FIG. 13 is thicker than the thickness t0 of the insulating substrate 10. The thickness t2 is, for example, 0.8 mm or thicker. The respective surfaces of the plurality of wiring layers 21 may be, for example, plated with nickel. As viewed in the thickness direction z, the plurality of heat dissipation layers 22 are located on the inner side of the peripheral edge of the insulating substrate 10. The plurality of heat dissipation layers 22 are each partially covered with the sealing resin 60.

As shown in FIG. 8 to FIG. 11, the plurality of heat dissipation layers 22 each include a second obverse face 221, a second reverse face 222, and a plurality of second end faces 223. The second obverse face 221 is oriented in the same direction as the first obverse face 211 of the plurality of wiring layers 21, in the thickness direction z. The second obverse face 221 is bonded to the insulating substrate 10. The second reverse face 222 is oriented in the opposite direction to the second obverse face 221. The second reverse face 222 is exposed from the sealing resin 60. The plurality of second end faces 223 are each connected to both of the second obverse face 221 and the second reverse face 222, and oriented in a direction orthogonal to the thickness direction z. The plurality of second end faces 223 include a pair of second faces 223A and a pair of fourth faces 223B. The pair of second faces 223A are spaced apart from each other in the first direction x. The pair of fourth faces 223B are spaced apart from each other in the second direction y.

As shown in FIG. 8 to FIG. 11, the pair of second faces 223A and the pair of fourth faces 223B are each formed as an inwardly recessed, concave surface on the corresponding one of the plurality of heat dissipation layers 22. In one of the plurality of heat dissipation layers 22, the pair of second faces 223A and the pair of fourth faces 223B are each formed in a tapered shape, so as to gradually expand outward from the second reverse face 222 toward the second obverse face 221, in the thickness direction z. Accordingly, in each of the plurality of heat dissipation layers 22, the second obverse face 221 is larger in area than the second reverse face 222. The mentioned shape of each of the pair of second faces 223A and the pair of fourth faces 223B is a result of a wet etching process performed to form the plurality of heat dissipation layers 22, from the metal layer bonded to the insulating substrate 10.

Figure 4:
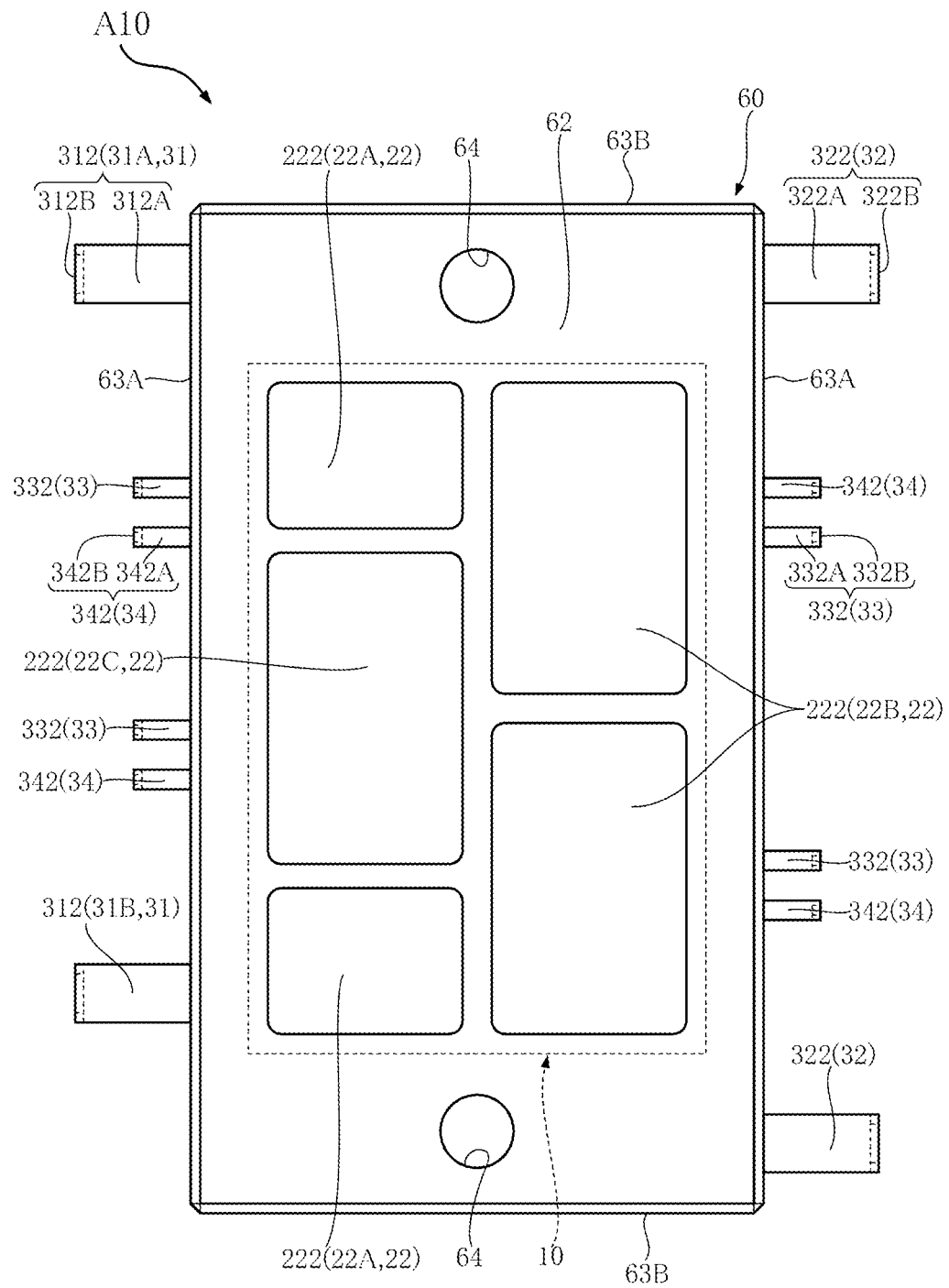
FIG. 4 is a bottom view of the semiconductor device shown in FIG. 1.
Figure 8:
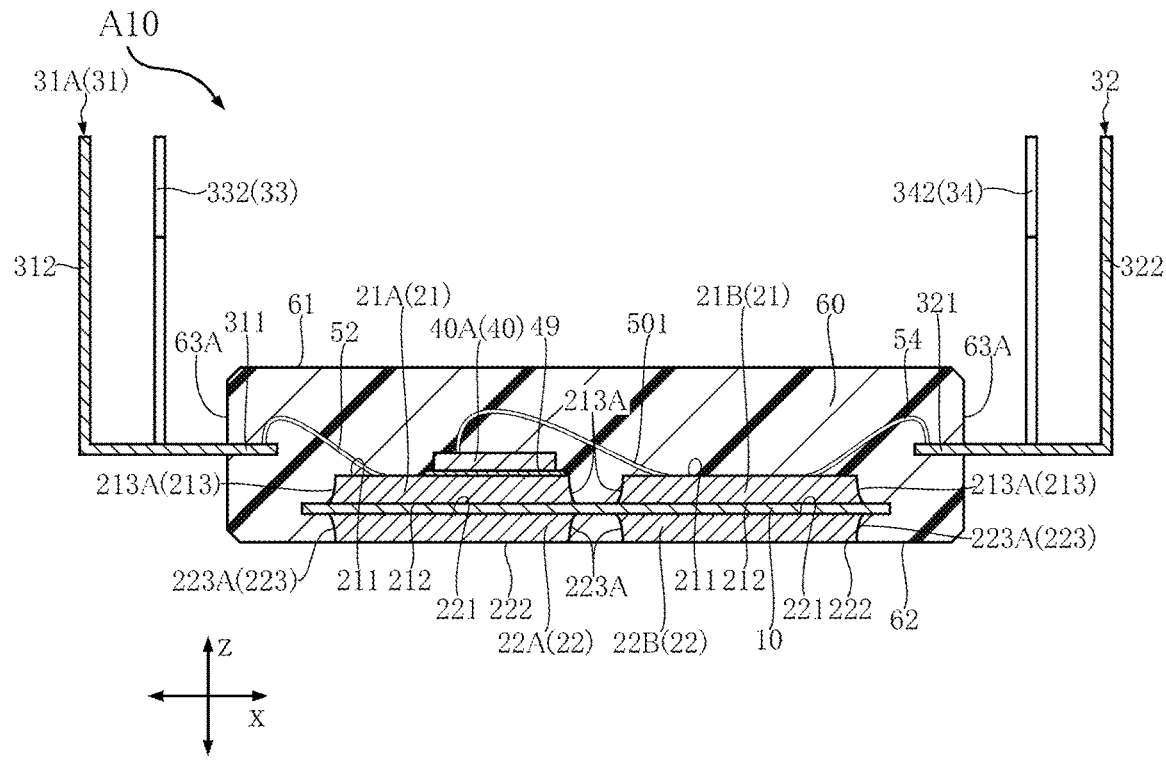
FIG. 8 is a cross-sectional view taken along a line VIII-VIII in FIG. 3.
Figure 9:
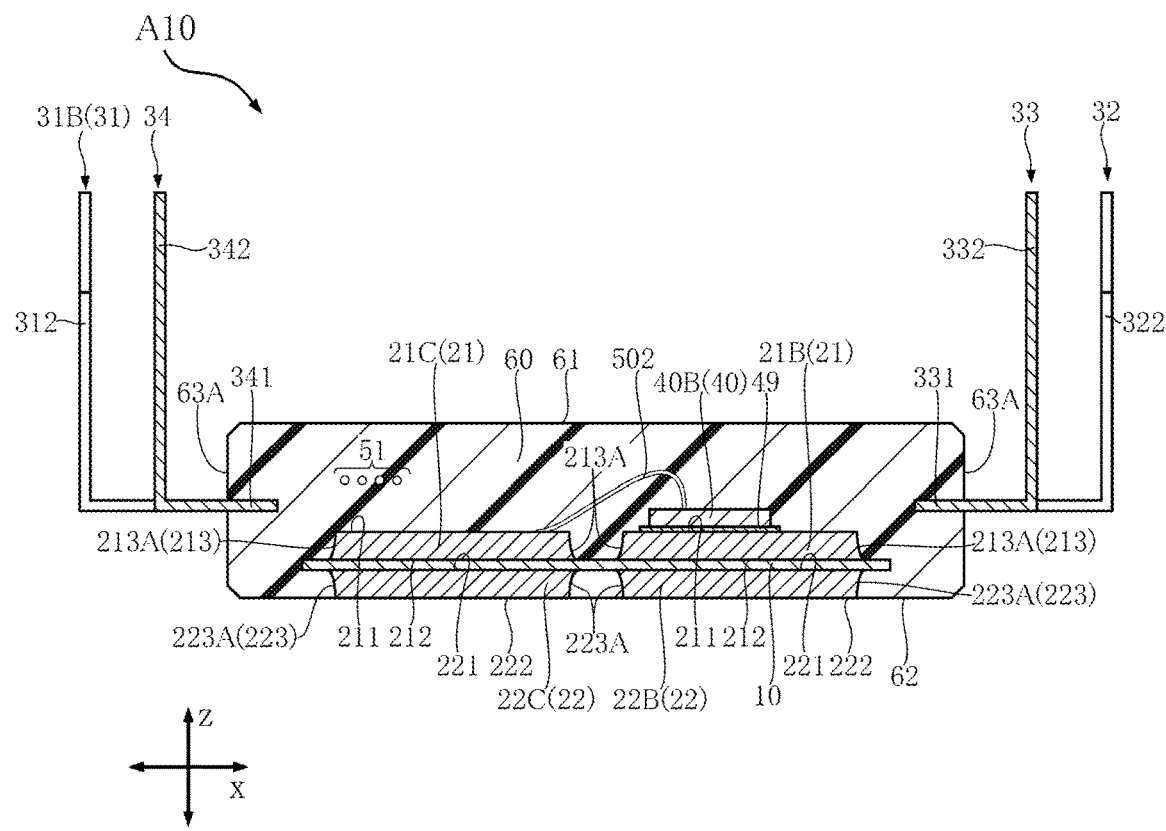
FIG. 9 is a cross-sectional view taken along a line IX-IX in FIG. 3.
Figure 10:
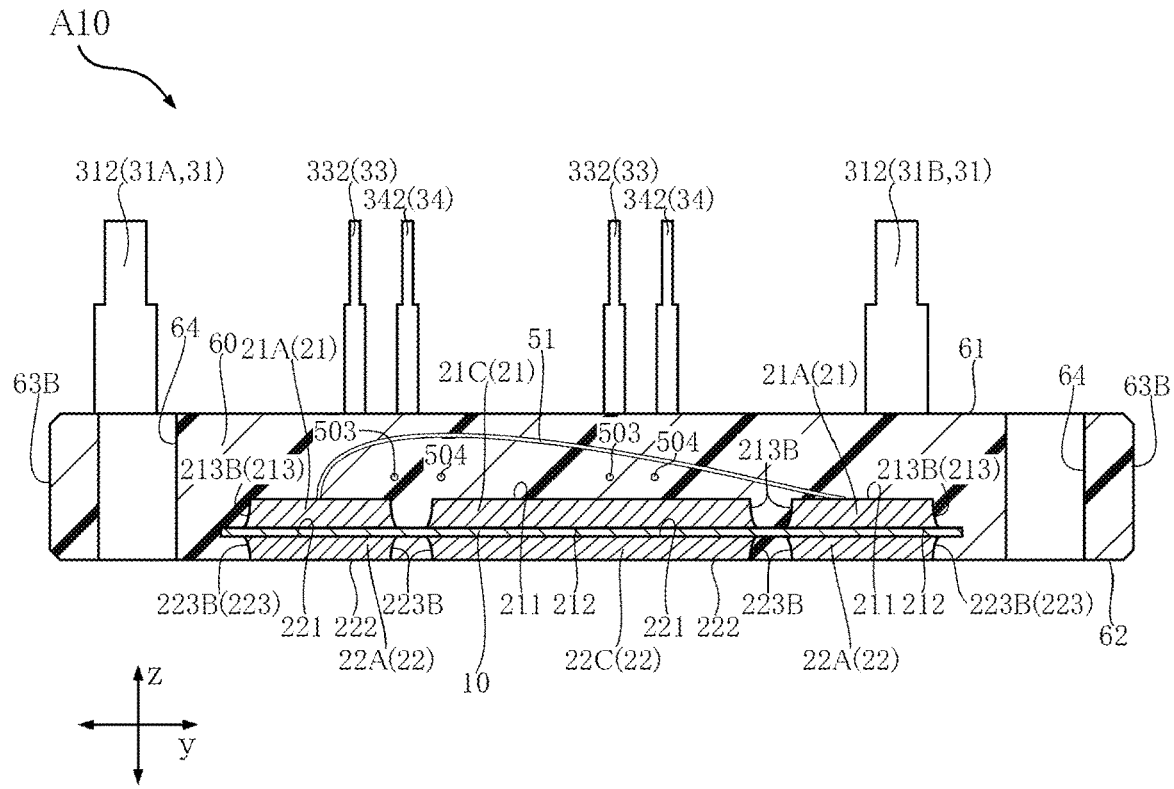
FIG. 10 is a cross-sectional view taken along a line X-X in FIG. 3.
Figure 11:
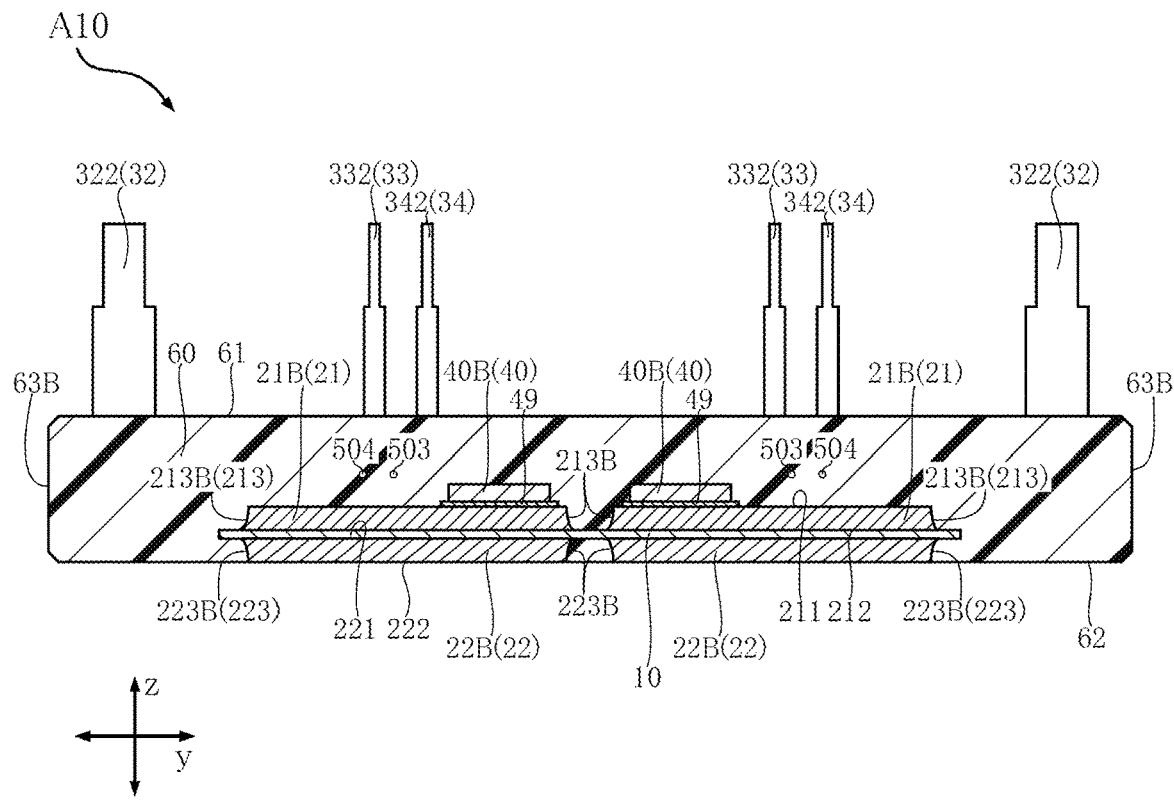
FIG. 11 is a cross-sectional view taken along a line XI-XI in FIG. 3.

In the example represented by the semiconductor device A10, as shown in FIG. 4, the plurality of heat dissipation layers 22 include a pair of first heat dissipation layers 22A, a pair of second heat dissipation layers 22B, and a third heat dissipation layer 22C. The pair of first heat dissipation layers 22A are located on one side in the first direction x, on the insulating substrate 10. The pair of first heat dissipation layers 22A are spaced apart from each other in the second direction y. As shown in FIG. 3, FIG. 4, and FIG. 8 to FIG. 10, the pair of first heat dissipation layers 22A respectively overlap with the pair of first wiring layers 21A, as viewed in the thickness direction z. The pair of second heat dissipation layers 22B are located on the other side in the first direction x, on the insulating substrate 10. The pair of second heat dissipation layers 22B are spaced apart from each other in the second direction y. As shown in FIG. 3, FIG. 4, FIG. 8, FIG. 9, and FIG. 11, the pair of second heat dissipation layers 22B respectively overlap with the pair of second wiring layers 21B, as viewed in the thickness direction z. The third heat dissipation layer 22C is located on one side in the first direction x on the insulating substrate 10, and between the pair of first heat dissipation layers 22A. As shown in FIG. 3, FIG. 4, and FIG. 10, the third heat dissipation layer 22C overlaps with the third wiring layer 21C, as viewed in the thickness direction z. Thus, as viewed in the thickness direction z, the plurality of wiring layers 21 respectively overlap with the plurality of heat dissipation layers 22. As viewed in the thickness direction z, the respective shapes of the plurality of wiring layers 21 and the plurality of heat dissipation layers 22, overlapping with each other, are the same. In the semiconductor device A10, in each of the plurality of wiring layers 21 and each of the plurality of heat dissipation layers 22, the plurality of second end faces 223 are each located at the same position as the corresponding one of the plurality of first end faces 213, as viewed in the thickness direction z.

As shown in FIG. 2 to FIG. 4, the pair of input terminals 31 are located on one side of the semiconductor device A10, in the first direction x. The pair of input terminals 31 are spaced apart from each other in the second direction y. The pair of input terminal 31 receives a DC from an external power source. In the example represented by the semiconductor device A10, the pair of input terminals 31 are formed from the same lead frame, as is the case with the pair of output terminals 32, the plurality of gate terminals 33, and the plurality of detection terminals 34. The lead frame contains copper or a copper-based alloy. The pair of input terminals 31 include a first input terminal 31A and a second input terminal 31B. The first input terminal 31A constitutes the positive electrode (P-terminal) of the pair of input terminals 31. The second input terminal 31B constitutes the negative electrode (N-terminal) of the pair of input terminals 31. The first input terminal 31A and the second input terminal 31B each include a pad section 311 and a terminal section 312.

As shown in FIG. 3, the pad section 311 is spaced apart from the insulating substrate 10 in the first direction x, and covered with the sealing resin 60. Thus, the pair of input terminals 31 are supported by the sealing resin 60. Here, the surface of the pad section 311 may be, for example, plated with silver.

Figure 6:
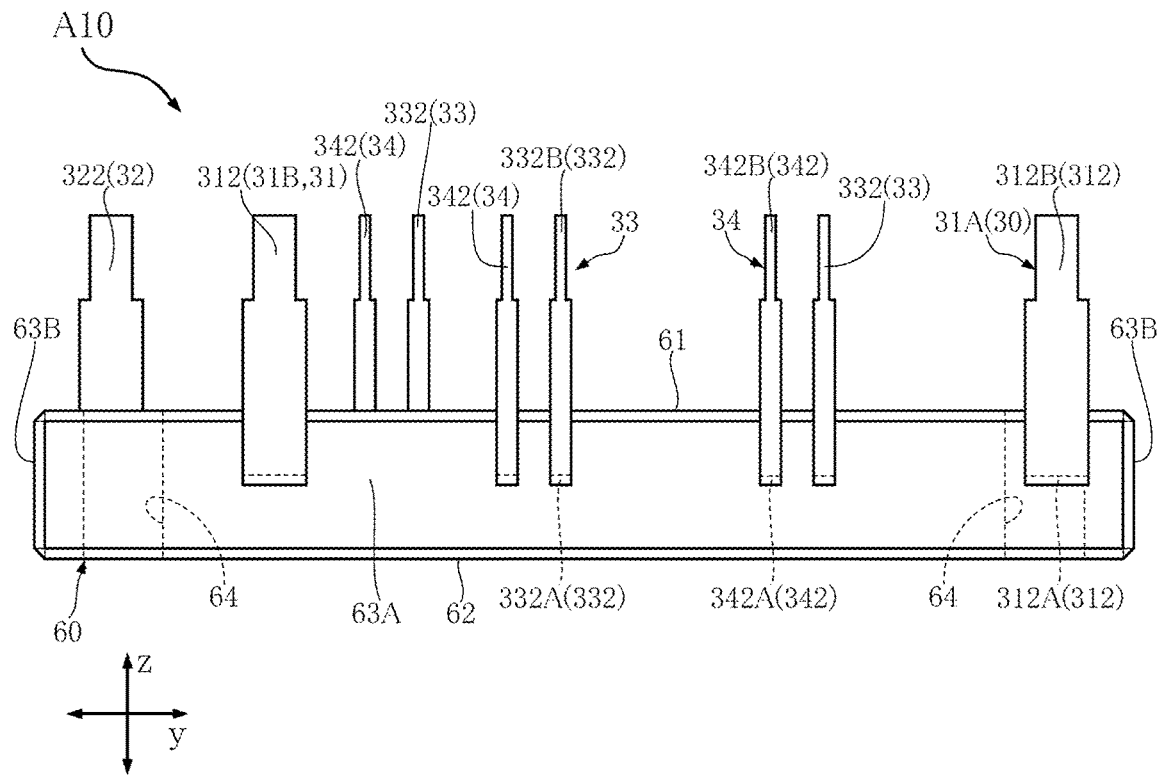
FIG. 6 is a left-side view of the semiconductor device shown in FIG. 1.
Figure 7:
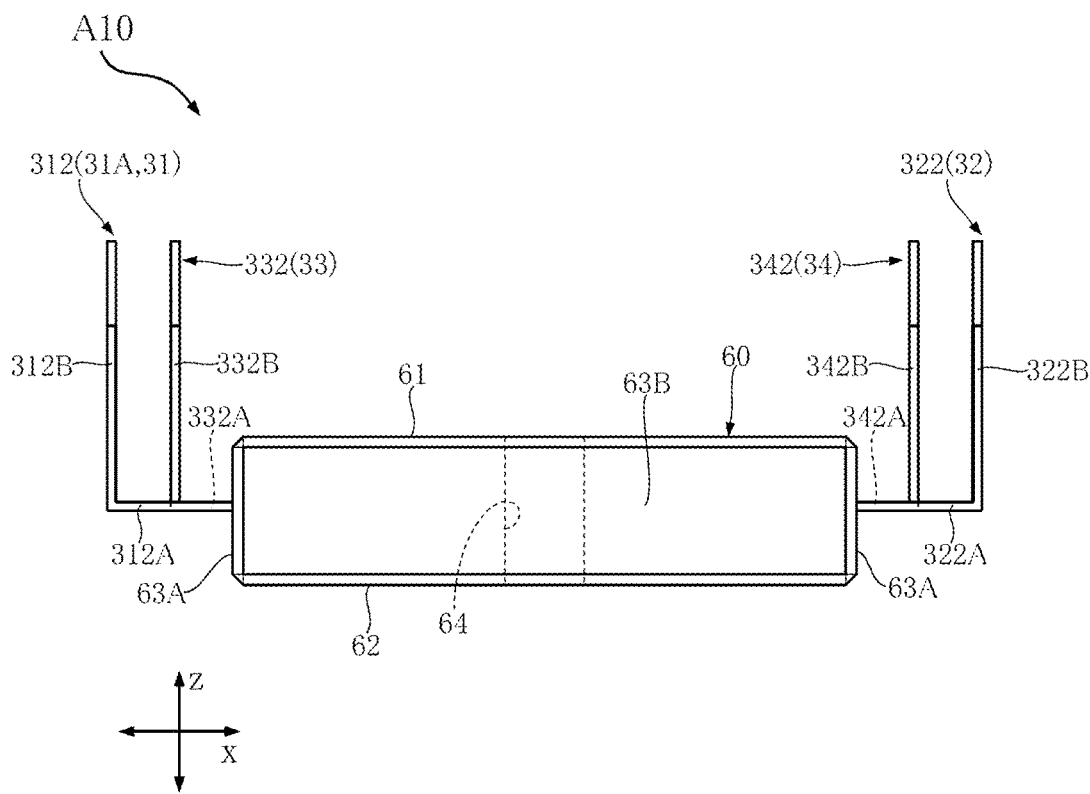
FIG. 7 is a front view of the semiconductor device shown in FIG. 1.

As shown in FIG. 3, the terminal section 312 is connected to the pad section 311, and exposed from the sealing resin 60. The terminal section 312 is utilized when the semiconductor device A10 is mounted on a circuit board. The terminal section 312 includes a base portion 312A and an upright portion 312B. The base portion 312A is connected to the pad section 311, and extends in the first direction x from a first side face 63A (to be subsequently described in detail) on one side of the sealing resin 60 in the first direction x. As shown in FIG. 6, the upright portion 312B extends from the distal end of the base portion 312A in the first direction x, in the direction in which the first obverse face 211 of the plurality of wiring layers 21 is oriented, in the thickness direction z. Accordingly, as shown in FIG. 7 to FIG. 9, the terminal section 312 is formed in an L-shape, as viewed in the second direction y. Here, the surface of the terminal section 312 may be, for example, plated with nickel.

As shown in FIG. 2 to FIG. 4, the pair of output terminals 32 are located on the other side of the semiconductor device A10, in the first direction x. The pair of output terminals 32 are spaced apart from each other in the second direction y. The pair of output terminals 32 outputs an AC (voltage) converted by the plurality of semiconductor elements 40. The pair of output terminals 32 each include a pad section 321 and a terminal section 322. Here, the number of output terminals 32 is not limited to this embodiment, but may be designed as desired, depending on the expected performance level of the semiconductor device A10.

As shown in FIG. 3, the pad section 321 is spaced apart from the insulating substrate 10 in the first direction x, and covered with the sealing resin 60. Thus, the pair of output terminals 32 are supported by the sealing resin 60. Here, the surface of the pad section 321 may be, for example, plated with silver.

Figure 5:
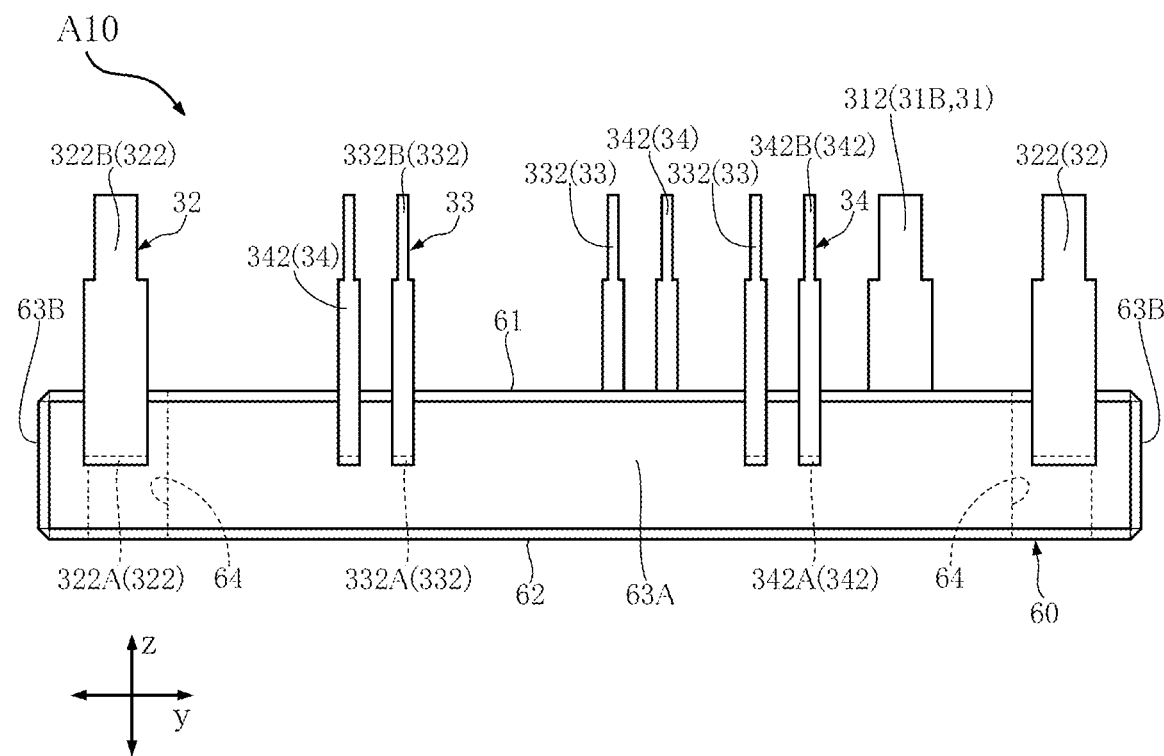
FIG. 5 is a right-side view of the semiconductor device shown in FIG. 1.

As shown in FIG. 3, the terminal section 322 is connected to the pad section 321, and exposed from the sealing resin 60. The terminal section 322 is utilized when the semiconductor device A10 is mounted on a circuit board. The terminal section 322 includes a base portion 322A and an upright portion 322B. The base portion 322A is connected to the pad section 321, and extends in the first direction x from a first side face 63A (to be subsequently described in detail) on the other side of the sealing resin 60 in the first direction x. As shown in FIG. 5, the upright portion 322B extends from the distal end of the base portion 322A in the first direction x, in the direction in which the first obverse face 211 of the plurality of wiring layers 21 is oriented, in the thickness direction z. Accordingly, as shown in FIG. 7 to FIG. 9, the terminal section 322 is formed in an L-shape, as viewed in the second direction y. The terminal section 322 has the same shape as that of the terminal section 312 of the pair of input terminals 31. Here, the surface of the terminal section 322 may be, for example, plated with nickel.

As shown in FIG. 3, FIG. 8, FIG. 9, and FIG. 11, the plurality of semiconductor elements 40 are each bonded to the first obverse face 211 of one of the plurality of wiring layers 21. The plurality of semiconductor elements 40 each have a rectangular shape (in semiconductor device A10, square shape), as viewed in the thickness direction z. The plurality of semiconductor elements 40 are each a MOSFET formed of a semiconductor material predominantly composed of silicon carbonate (SiC). Alternatively, the plurality of semiconductor elements 40 may each be a switching element such as a field-effect transistor including a metal-insulator-semiconductor field-effect transistor (MISFET), or a bipolar transistor including an insulated gate bipolar transistor (IGBT), without limitation to the MOSFET. Further, the plurality of semiconductor elements 40 may be, not only the switching element, but a rectifier element such as a Schottky barrier diode. In the following description of the semiconductor device A10, it will be assumed that the plurality of semiconductor elements 40 are n-channel type MOSFETs.

In the example represented by the semiconductor device A10, as shown in FIG. 3, the plurality of semiconductor elements 40 include a pair of first elements 40A and a pair of second elements 40B. The pair of first elements 40A are respectively bonded to the first obverse face 211 of the pair of first wiring layers 21A. The pair of first elements 40A constitute the upper arm circuit (high-voltage region) of the semiconductor device A10. The pair of second elements 40B are respectively bonded to the first obverse face 211 of the pair of second wiring layers 21B. The pair of second elements 40B constitute a lower arm circuit (low-voltage region) of the semiconductor device A10. Here, the number of semiconductor elements 40 is not limited to this embodiment, but may be designed as desired, depending on the expected performance level of the semiconductor device A10.

Figure 12:
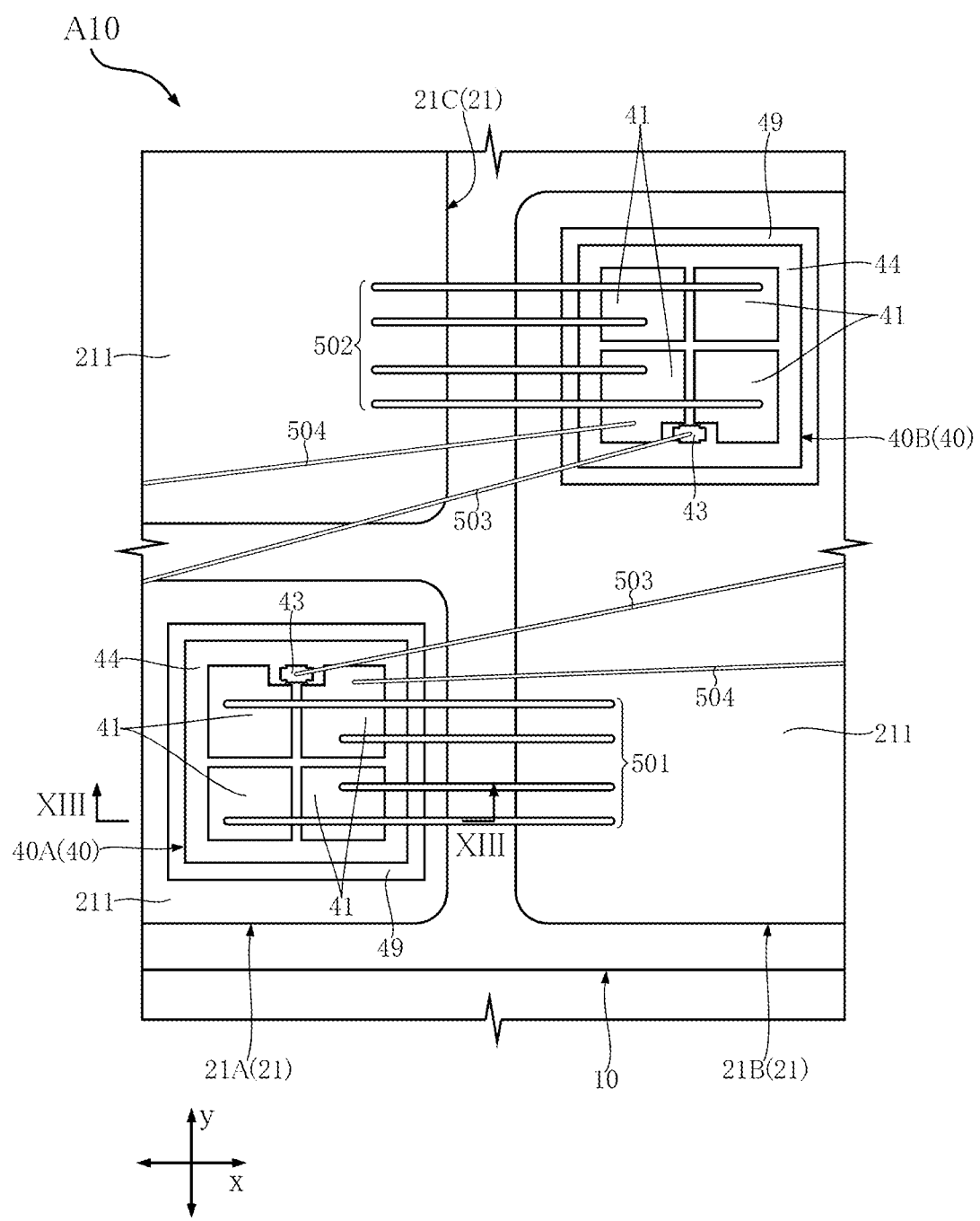
FIG. 12 is a partially enlarged view of FIG. 3.

As shown in FIG. 12 and FIG. 13, the plurality of semiconductor elements 40 each include a first electrode 41, a second electrode 42, a gate electrode 43, and an insulation film 44.

As shown in FIG. 13, the first electrode 41 is located farthest from the first obverse face 211 of the plurality of wiring layers 21, in the thickness direction z. In each of the plurality of semiconductor elements 40, the first electrode 41 receives a source current from the inside of the corresponding semiconductor element 40. As shown in FIG. 12, the first electrode 41 is divided into four portions, in the example represented by the semiconductor device A10.

As shown in FIG. 13, the second electrode 42 is located closest to the first obverse face 211 of the plurality of wiring layers 21, in the thickness direction z. Accordingly, in each of the plurality of semiconductor elements 40, the second electrode 42 is located on the opposite side of the first electrode 41. In each of the plurality of semiconductor elements 40, a drain current runs through the second electrode 42, toward the inside of the corresponding semiconductor element 40. The second electrode 42 is bonded to the first obverse face 211 of one of the plurality of wiring layers 21, via a conductive bonding layer 49. In other words, the second electrodes 42 of the pair of semiconductor elements 40 are bonded to the first obverse faces 211 of the pair of first wiring layers 21A, via the bonding layer 49. The second electrodes 42 of the pair of semiconductor elements 40 are bonded to the first obverse faces 211 of the pair of second wiring layers 21B, via the bonding layer 49. Accordingly, the second electrodes 42 of the pair of first elements 40A are electrically connected to the pair of first wiring layers 21A, respectively. The second electrodes 42 of the pair of second elements 40B are electrically connected to the pair of first wiring layers 21B, respectively. The bonding layer 49 is, for example, formed of lead-free solder predominantly composed of tin (Sn), or sintered silver.

As shown in FIG. 12, the gate electrode 43 is located generally at the same position as the first electrode 41, in the thickness direction z. In each of the plurality of semiconductor elements 40, gate electrode 43 receives a gate voltage for driving the corresponding semiconductor element 40.

The gate electrode 43 is smaller in size than one of the divided four portions of the first electrode 41.

As shown in FIG. 12 and FIG. 13, the insulation film 44 is located generally at the same position as the first electrode 41 and the gate electrode 43, in the thickness direction z. The insulation film 44 surrounds each of the first electrode 41 and the gate electrode 43, as viewed in the thickness direction z. The insulation film 44 is formed of, for example, a silicon dioxide ($SiO_2$) layer, a silicon nitride layer, and a polybenzoxazole (PBO) layer, stacked in this order in the direction away from the first obverse face 211 of the plurality of wiring layers 21. In the insulation film 44, the polybenzoxazole layer may be substituted with a polyimide layer.

The plurality of first wires 501 are, as shown in FIG. 3 and FIG. 8, each bonded to the first electrode 41 of the pair of first elements 40A and the first obverse face 211 of the pair of second wiring layers 21B. In the example represented by the semiconductor device A10, eight first wires 501 are provided. Out of these, four of the first wires 501 are bonded to the first electrode 41 of one of the first elements 40A, and the first obverse face 211 of one of the second wiring layers 21B adjacent to the mentioned first element 40A in the first direction x. The remaining four first wires 501 are bonded to the first electrode 41 of the other first element 40A, and the first obverse face 211 of the other second wiring layer 21B adjacent to the mentioned first element 40A in the first direction x. Accordingly, the first electrodes 41 of the pair of first elements 40A are electrically connected to the pair of second wiring layers 21B, respectively. The plurality of first wires 501 are, for example, formed of a metal containing aluminum.

The plurality of second wires 502 are, as shown in FIG. 3 and FIG. 9, each bonded to the first electrode 41 of the pair of second elements 40B and the first obverse face 211 of the third wiring layer 21C. In the example represented by the semiconductor device A10, eight second wires 502 are provided. Out of these, four of the second wires 502 are bonded to the first electrode 41 of one of the second elements 40B, and the first obverse face 211 of the third wiring layer 21C. The remaining four second wires 502 are bonded to the first electrode 41 of the other second element 40B, and the first obverse face 211 of the third wiring layer 21C. Accordingly, the first electrodes 41 of the pair of second elements 40B are electrically connected to the third wiring layer 21C. The plurality of second wires 502 are, for example, formed of a metal containing aluminum.

The plurality of gate terminals 33 are, as shown in FIG. 2 to FIG. 4, located on both sides of the semiconductor device A10 in the first direction x. In the example represented by the semiconductor device A10, the number of gate terminals 33 corresponds to the number of semiconductor elements 40. The plurality of gate terminals 33 each receive a gate voltage for driving the corresponding one of the plurality of semiconductor elements 40. The plurality of gate terminals 33 each include a pad section 331 and a terminal section 332.

As shown in FIG. 3, the pad section 331 is spaced apart from the insulating substrate 10 in the first direction x, and covered with the sealing resin 60. Accordingly, the plurality of gate terminals 33 are supported by the sealing resin 60. The surface of the pad section 331 may be, for example, plated with silver.

As shown in FIG. 3, the terminal section 332 is connected to the pad section 331, and exposed from the sealing resin 60. The terminal section 332 is utilized when the semiconductor device A10 is mounted on a circuit board. The terminal section 332 includes a base portion 332A and an upright portion 332B. The base portion 332A is connected to the pad section 331, and extends in the first direction x, from one of the pair of first side faces 63A (to be subsequently described in detail) of the sealing resin 60. The base portion 332A is smaller in size in the first direction x, than the base portion 312A of the pair of input terminals 31, and the base portion 322A of the pair of output terminals 32. As shown in FIG. 5 and FIG. 6, the upright portion 332B extends from the distal end of the base portion 332A in the first direction x, in the direction in which the first obverse face 211 of the plurality of wiring layers 21 is oriented, in the thickness direction z. Accordingly, as shown in FIG. 7 to FIG. 9, the terminal section 332 is formed in an L-shape, as viewed in the second direction y. Here, the surface of the terminal section 332 may be, for example, plated with nickel.

The plurality of gate wires 503 are, as shown in FIG. 3 and FIG. 12, respectively bonded to the gate electrode 43 of the plurality of semiconductor elements 40, and the pad section 331 of the plurality of gate terminals 33. Accordingly, the plurality of gate terminals 33 are electrically connected to the gate electrode 43 of the plurality of semiconductor elements 40, respectively. The plurality of gate wires 503 are, for example, formed of a metal containing gold or aluminum.

As shown in FIG. 3, the pair of gate terminals 33, electrically connected to the gate electrode 43 of the pair of first elements 40A, are located on the other side in the first direction x, on the semiconductor device A10. Such pair of gate terminals 33 are located between the pair of output terminals 32, in the second direction y. The pair of gate terminals 33, electrically connected to the gate electrode 43 of the pair of second elements 40B, are located on one side in the first direction x, on the semiconductor device A10. Such pair of gate terminals 33 are located between the pair of input terminals 31, in the second direction y.

The plurality of detection terminals 34 are, as shown in FIG. 2 to FIG. 4, located on both sides of the semiconductor device A10 in the first direction x. In the example represented by the semiconductor device A10, the number of detection terminals 34 corresponds to the number of semiconductor elements 40. The plurality of detection terminals 34 each receive a voltage corresponding to the source current supplied to the first electrode 41 of the corresponding one of the plurality of semiconductor elements 40. In a circuit formed on a circuit board on which the semiconductor device A10 is mounted, the source current supplied to the respective first electrodes 41 of the plurality of semiconductor elements 40 is detected, on the basis of the voltage applied to each of the plurality of detection terminals 34. The plurality of detection terminals 34 each include a pad section 341 and a terminal section 342.

As shown in FIG. 3, the pad section 341 is spaced apart from the insulating substrate 10 in the first direction x, and covered with the sealing resin 60. Accordingly, the plurality of detection terminals 34 are supported by the sealing resin 60. The surface of the pad section 341 may be, for example, plated with silver.

As shown in FIG. 3, the terminal section 342 is connected to the pad section 341, and exposed from the sealing resin 60. The terminal section 342 is utilized when the semiconductor device A10 is mounted on a circuit board. The terminal section 342 includes a base portion 342A and an upright portion 342B. The base portion 342A is connected to the pad section 341, and extends in the first direction x, from one of the pair of first side faces 63A (to be subsequently described in detail) of the sealing resin 60. The base portion 342A is smaller in size in the first direction x, than the base portion 312A of the pair of input terminals 31, and the base portion 322A of the pair of output terminals 32. As shown in FIG. 5 and FIG. 6, the upright portion 342B extends from the distal end of the base portion 342A in the first direction x, in the direction in which the first obverse face 211 of the plurality of wiring layers 21 is oriented, in the thickness direction z. Accordingly, as shown in FIG. 7 to FIG. 9, the terminal section 342 is formed in an L-shape, as viewed in the second direction y. Here, the surface of the terminal section 342 may be, for example, plated with nickel.

The plurality of detection wires 504 are, as shown in FIG. 3 and FIG. 12, respectively bonded to the first electrode 41 of the plurality of semiconductor elements 40, and the pad section 341 of the plurality of detection terminals 34. Accordingly, the plurality of detection terminals 34 are electrically connected to the first electrode 41 of the plurality of semiconductor elements 40, respectively. The plurality of detection wires 504 are, for example, formed of a metal containing aluminum.

As shown in FIG. 3, the plurality of detection terminals 34 are each located adjacent to one of the plurality of gate terminals 33, associated with the semiconductor element 40 with which the detection terminal 34 is electrically continuous. These two terminals are adjacent to each other in the second direction y. In the semiconductor device A10, such two terminals thus constitute a set, and are located in association with one of the plurality of semiconductor elements 40.

The first conductive material 51 is, as shown in FIG. 3 and FIG. 10, bonded to the first obverse face 211 of the pair of first wiring layers 21A. Accordingly, the pair of first wiring layers 21A are electrically connected to each other. The first conductive material 51 extends in the second direction y so as to stride over the third wiring layer 21C, as viewed in the thickness direction z. In the example represented by the semiconductor device A10, the first conductive material 51 is composed of a plurality of wires. The plurality of wires are, for example, formed of a metal containing aluminum. Here, the first conductive material 51 may be formed of a metal lead containing copper, instead of the plurality of wires.

The second conductive material 52 is, as shown in FIG. 3 and FIG. 8, bonded to the pad section 311 of the first input terminal 31A and the first obverse face 211 of one of the first wiring layers 21A. Accordingly, the first input terminal 31A is electrically connected to the second electrode 42 of the pair of first elements 40A, via the pair of first wiring layers 21A and the first conductive material 51. In the example represented by the semiconductor device A10, the second conductive material 52 is composed of a plurality of wires. The plurality of wires are, for example, formed of a metal containing aluminum.

The third conductive material 53 is, as shown in FIG. 3, bonded to the pad section 311 of the second input terminal 31B, and the first obverse face 211 of the third wiring layer 21C. Accordingly, the second input terminal 31B is electrically connected to the first electrode 41 of the pair of second elements 40B, via the third wiring layer 21C and the plurality of second wires 502. In the example represented by the semiconductor device A10, the third conductive material 53 is composed of a plurality of wires. The plurality of wires are, for example, formed of a metal containing aluminum.

The pair of fourth conductive materials 54 are, as shown in FIG. 3 and FIG. 4, respectively bonded to the pad section 321 of the pair of output terminals 32, and the first obverse face 211 of the pair of second wiring layers 21B. Accordingly, the pair of output terminals 32 are electrically connected to the second electrode 42 of the pair of second elements 40B, respectively, via the pair of second wiring layers 21B. In the example represented by the semiconductor device A10, the pair of fourth conductive materials 54 are each composed of a plurality of wires. The plurality of wires are, for example, formed of a metal containing aluminum.

The sealing resin 60 covers, as shown in FIG. 8 to FIG. 11, the insulating substrate 10, the plurality of wiring layers 21, the plurality of semiconductor elements 40, and a part of each of the plurality of heat dissipation layers 22. The sealing resin 60 also covers the plurality of first wires 501, the plurality of second wires 502, the plurality of gate wires 503, the plurality of detection wires 504, the first conductive material 51, the second conductive material 52, the third conductive material 53, and the pair of fourth conductive materials 54. The sealing resin 60 is formed of a material predominantly composed of an epoxy resin. As shown in FIG. 2 to FIG. 7 (except FIG. 3), the sealing resin 60 includes a top face 61, a bottom face 62, a pair of first side faces 63A, a pair of second side faces 63B, and a pair of fastening holes 64.

As shown in FIG. 8 to FIG. 11, the top face 61 is oriented in the same direction as the first obverse face 211 of the plurality of wiring layers 21, in the thickness direction z. The bottom face 62 is oriented in the opposite direction to the top face 61. As shown in FIG. 4, the respective second reverse faces 222 of the plurality of heat dissipation layers 22 are exposed from the bottom face 62. The bottom face 62 surrounds the periphery of the second reverse face 222 of the plurality of heat dissipation layers 22.

As shown in FIG. 2 to FIG. 6 (except FIG. 3), the pair of first side faces 63A are connected to both of the top face 61 and the bottom face 62, and spaced apart from each other in the first direction x. From one of the first side faces 63A on one side of the semiconductor device A10 in the first direction x, the terminal section 312 of the pair of input terminal 31, the terminal section 332 of the pair of gate terminals 33 associated with the pair of second elements 40B, and the terminal section 342 of the pair of detection terminals 34, are exposed. From the other first side face 63A on the other side of the semiconductor device A10 in the first direction x, the output terminal sections 322 of the pair of output terminals 32, the terminal section 332 of the pair of gate terminals 33 associated with the pair of first elements 40A, and the terminal section 342 of the pair of detection terminals 34, are exposed. As shown in FIG. 2, FIG. 4, and FIG. 7, the pair of second side faces 63B are connected to both of the top face 61 and the bottom face 62, and spaced apart from each other in the second direction y. The pair of second side faces 63B are each connected to the pair of first side faces 63A.

As shown in FIG. 2, FIG. 4, and FIG. 10, the pair of fastening holes 64 are formed so as to penetrate through the sealing resin 60 in the thickness direction z, from the top face 61 to the bottom face 62. As viewed in the thickness direction z, the pair of fastening holes 64 each have a circular edge. The pair of fastening holes 64 located on the respective sides of the insulating substrate 10, in the second direction y. The pair of fastening holes 64 are utilized when the semiconductor device A10 is attached to a heatsink.

Variation of First Embodiment

Figure 14:
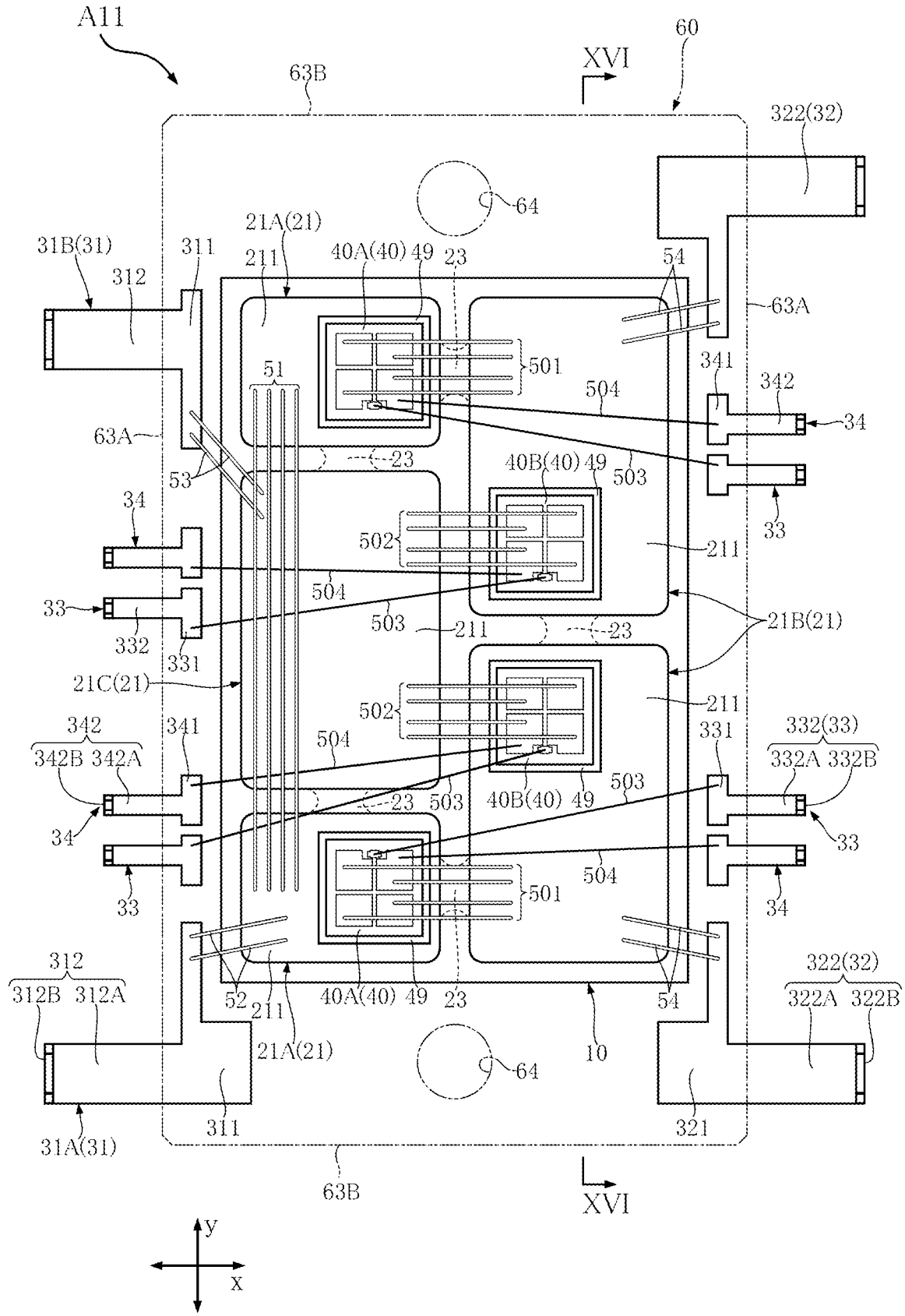
FIG. 14 is a plan view of a semiconductor device according to a variation of the first embodiment of the present disclosure, seen through the sealing resin.
Figure 15:
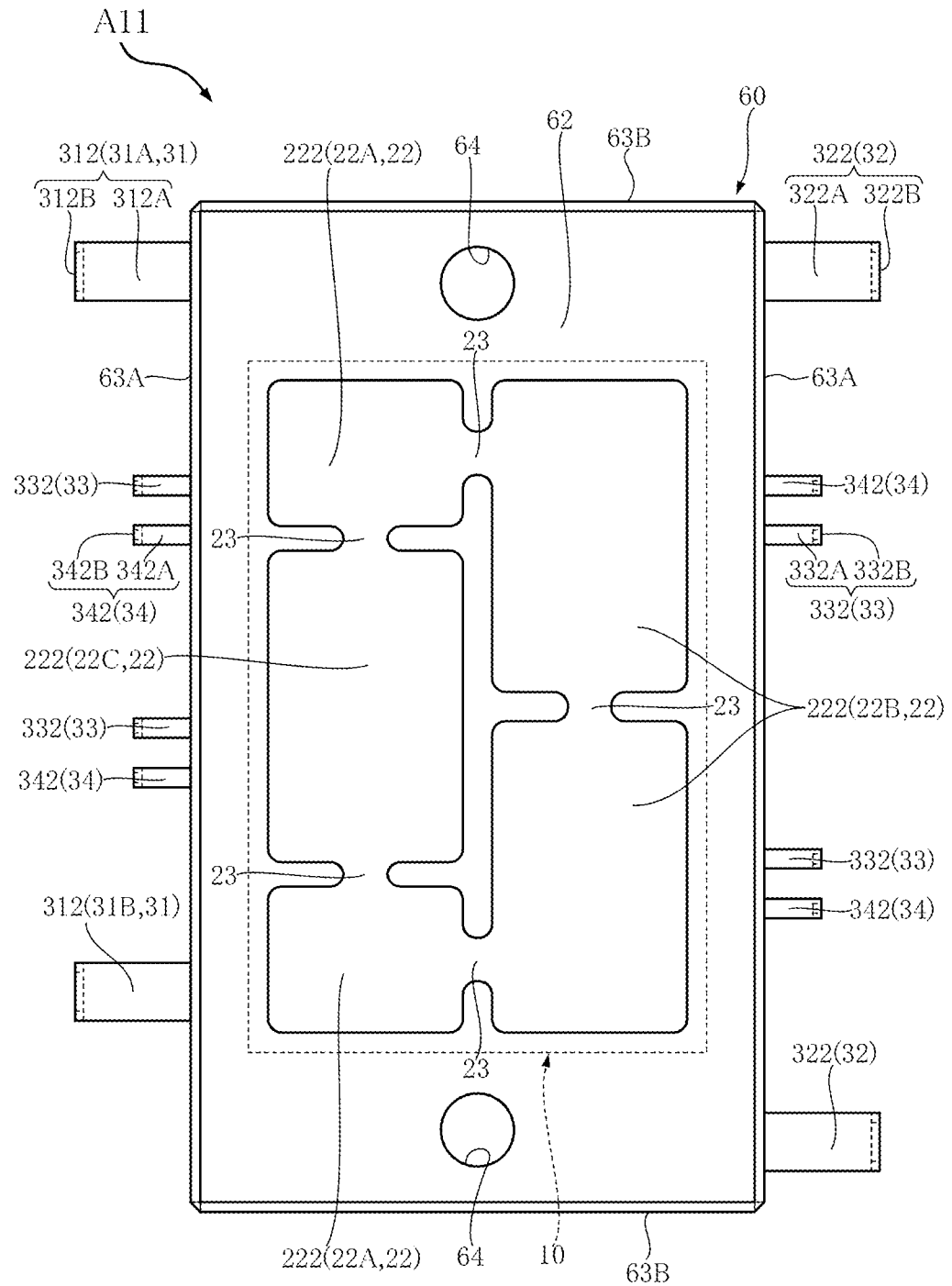
FIG. 15 is a bottom view of the semiconductor device shown in FIG. 14.
Figure 16:
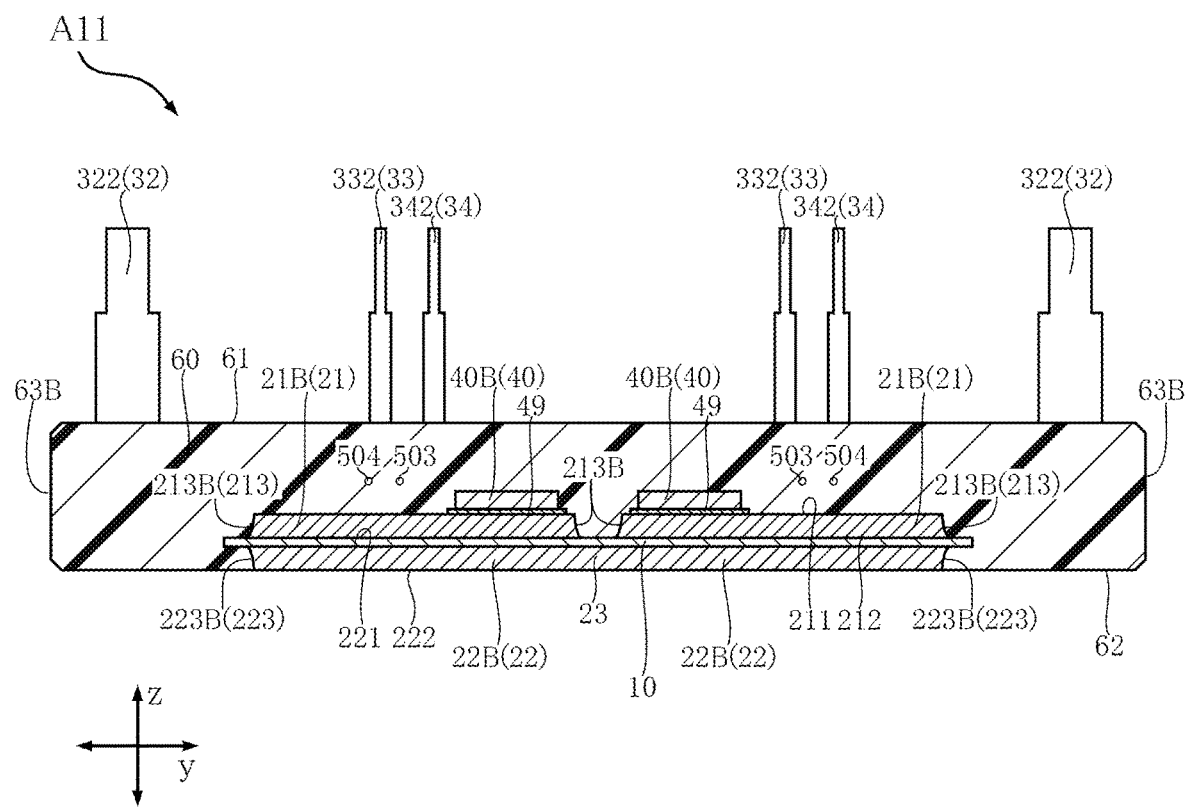
FIG. 16 is a cross-sectional view taken along a line XVI-XVI in FIG. 14.

Referring now to FIG. 14 to FIG. 16, a semiconductor device A11 according to a variation of the first embodiment of the present disclosure will be described hereunder. In FIG. 14 the sealing resin 60 is seen through, for the sake of clarity. The sealing resin 60 seen through is indicated by an imaginary line.

The semiconductor device A11 is different from the aforementioned semiconductor device A10, in including a plurality of joint layers 23.

The plurality of joint layers 23 are, as shown in FIG. 14 to FIG. 16, located on the opposite side of the plurality of wiring layers 21 in the thickness direction z, with respect to the insulating substrate 10. The plurality of joint layers 23 are bonded to the insulating substrate 10. The plurality of joint layers 23 formed of the same metal layer as the plurality of heat dissipation layers 22.

As shown in FIG. 15, the plurality of joint layers 23 each connect at least two of the plurality of heat dissipation layers 22 to each other. In each of the plurality of joint layers 23, the size in the direction orthogonal to both of the thickness direction z, and the direction in which the plurality of heat dissipation layers 22 are connected to each other (hereinafter, "width direction"), is smaller than the size in the width direction of the plurality of heat dissipation layers 22 connected via the joint layer 23.

The semiconductor device A10 provides the following advantageous effects.

The semiconductor device A10 includes the insulating substrate 10, the plurality of wiring layers 21 having the first reverse face 212 bonded to the insulating substrate 10, the plurality of heat dissipation layers 22 having the second obverse face 221 bonded to the insulating substrate 10, and the semiconductor elements 40 each bonded to the first obverse face 211 of one of the plurality of wiring layers 21. As viewed in the thickness direction z, the plurality of wiring layers 21 respectively overlap with the plurality of heat dissipation layers 22. In the manufacturing process of the semiconductor device A10, as well as during the use thereof, heat is transmitted to the plurality of wiring layers 21 and the plurality of heat dissipation layers 22. At this point, a difference in thermal distortion between the interface between the insulating substrate 10 and the plurality of wiring layers 21, and the interface between the insulating substrate 10 and the plurality of heat dissipation layers 22, is minimized. Accordingly, the distortion that the insulating substrate 10 may otherwise suffer can be suppressed. Therefore, the semiconductor device A10 is capable of suppressing the distortion of the insulating substrate 10, without compromising the heat dissipation performance.

The thickness t1 of each of the plurality of wiring layers 21 is thicker than the thickness t0 of the insulating substrate 10. Accordingly, heat resistance in a direction orthogonal to the thickness direction z of the plurality of wiring layers 21 can be reduced.

The thickness t2 of the plurality of heat dissipation layers 22 is thicker than the thickness t0 of the insulating substrate 10. Accordingly, heat resistance in a direction orthogonal to the thickness direction z of the plurality of heat dissipation layers 22 can be reduced.

As viewed in the thickness direction z, the respective shapes of the plurality of wiring layers 21, and the plurality of heat dissipation layers 22 overlapping with each other, are the same. Such a configuration prevents the distribution of thermal distortion over the interface between the insulating substrate 10 and the plurality of heat dissipation layers 22 from becoming uneven with respect to the distribution of thermal distortion over the interface between the insulating substrate 10 and the plurality of wiring layers 21.

In the semiconductor device A10, the respective second end faces 223 of the plurality of heat dissipation layers 22 are located at the same position as the corresponding first end faces 213 of the plurality of wiring layers 21, as viewed in the thickness direction z. Such a configuration allows the distribution of thermal distortion over the interface between the insulating substrate 10 and the plurality of wiring layers 21, and the distribution of thermal distortion over the interface between the insulating substrate 10 and the plurality of heat dissipation layers 22, to generally accord with each other.

The semiconductor device A10 also includes the sealing resin 60 covering the insulating substrate 10, the plurality of wiring layers 21, the semiconductor elements 40, and a part of the plurality of heat dissipation layers 22. The respective second reverse faces 222 of the plurality of heat dissipation layers 22 are exposed from the sealing resin 60. Therefore, a decline in heat dissipation performance of the semiconductor device A10 can be avoided.

As viewed in the thickness direction z, the plurality of wiring layers 21 and the plurality of heat dissipation layers 22 are both located on the inner side of the peripheral edge of the insulating substrate 10. Accordingly, the peripheral edge of the insulating substrate 10 and the vicinity thereof are covered with the sealing resin 60. Therefore, the insulating substrate 10 can be prevented from coming off from the sealing resin 60, despite the second reverse face 222 of the plurality of heat dissipation layers 22 being exposed from the sealing resin 60.

The semiconductor device A11 further includes the joint layers 23, located on the opposite side of the plurality of wiring layers 21 in the thickness direction z, with respect to the insulating substrate 10. The joint layers 23 are bonded to the insulating substrate 10, and each connect at least two of the plurality of heat dissipation layers 22 to each other. Such a configuration makes the heat distribution over the plurality of heat dissipation layers 22 more homogeneous.

Second Embodiment

Figure 17:
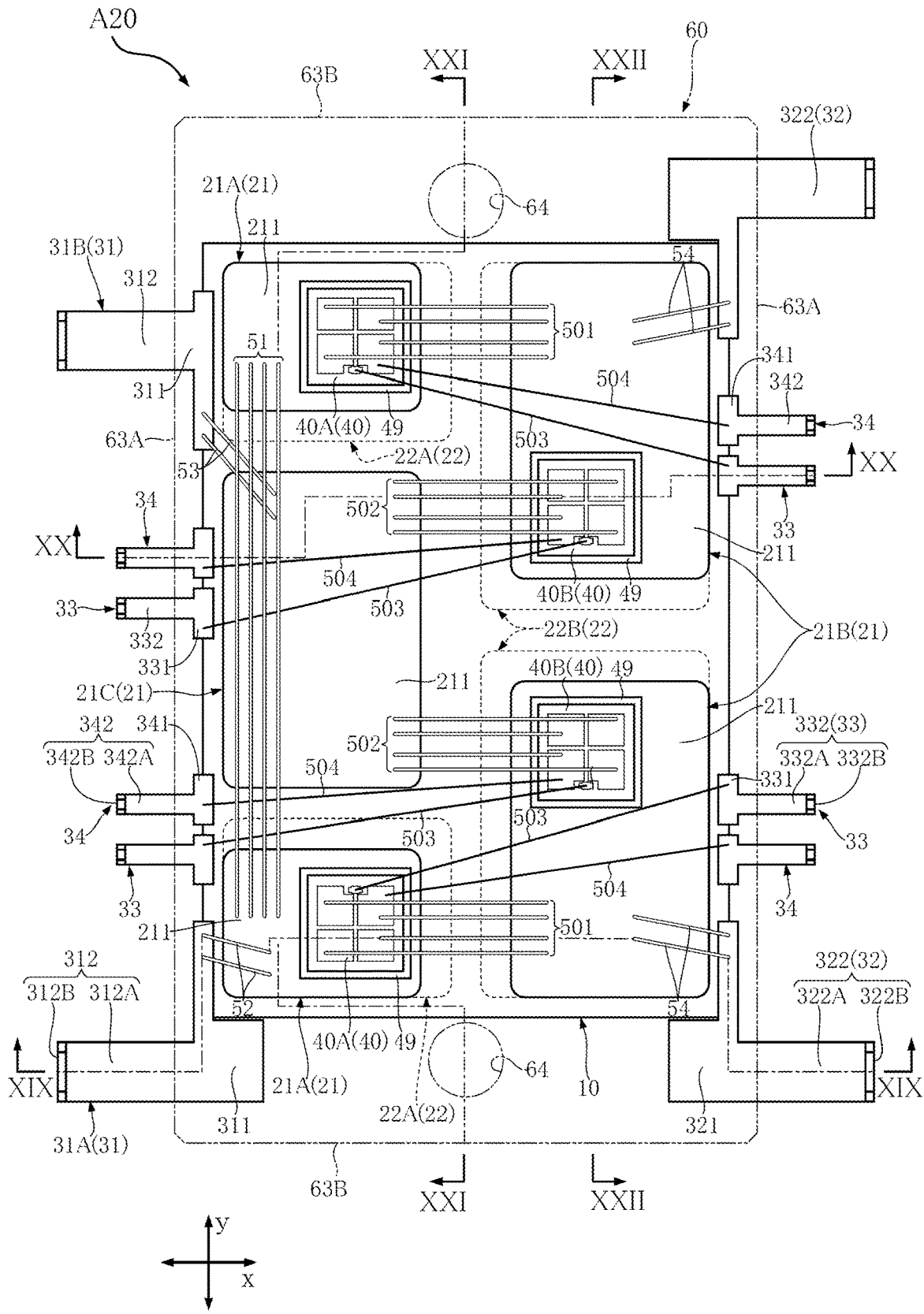
FIG. 17 is a plan view of a semiconductor device according to a second embodiment of the present disclosure, seen through the sealing resin.

Referring to FIG. 17 to FIG. 24, a semiconductor device A20 according to a second embodiment of the present disclosure will be described hereunder. In these drawings, the elements same as or similar to those of the foregoing semiconductor device A10 are given the same numeral, and the description thereof will not be repeated. In FIG. 17 the sealing resin 60 is seen through, for the sake of clarity. The sealing resin 60 seen through is indicated by an imaginary line.

The semiconductor device A20 is different from the semiconductor device A10, in the configuration of the plurality of wiring layers 21 and the plurality of heat dissipation layers 22.

As shown in FIG. 19 to FIG. 22, at least one of the plurality of second end faces 223 of the plurality of heat dissipation layers 22 is located on the outer side, with respect to at least one of the plurality of first end faces 213 of the plurality of wiring layers 21. In the example represented by the semiconductor device A20, at least one of the plurality of second end faces 223 of each of the pair of first heat dissipation layers 22A and the pair of second heat dissipation layers 22B, is located on the outer side, with respect to at least one of the plurality of first end faces 213 of the corresponding pair of first wiring layers 21A and the corresponding pair of second wiring layers 21B. Here, the plurality of semiconductor elements 40 are respectively bonded to the pair of first wiring layers 21A and the pair of second wiring layers 21B.

Figure 19:
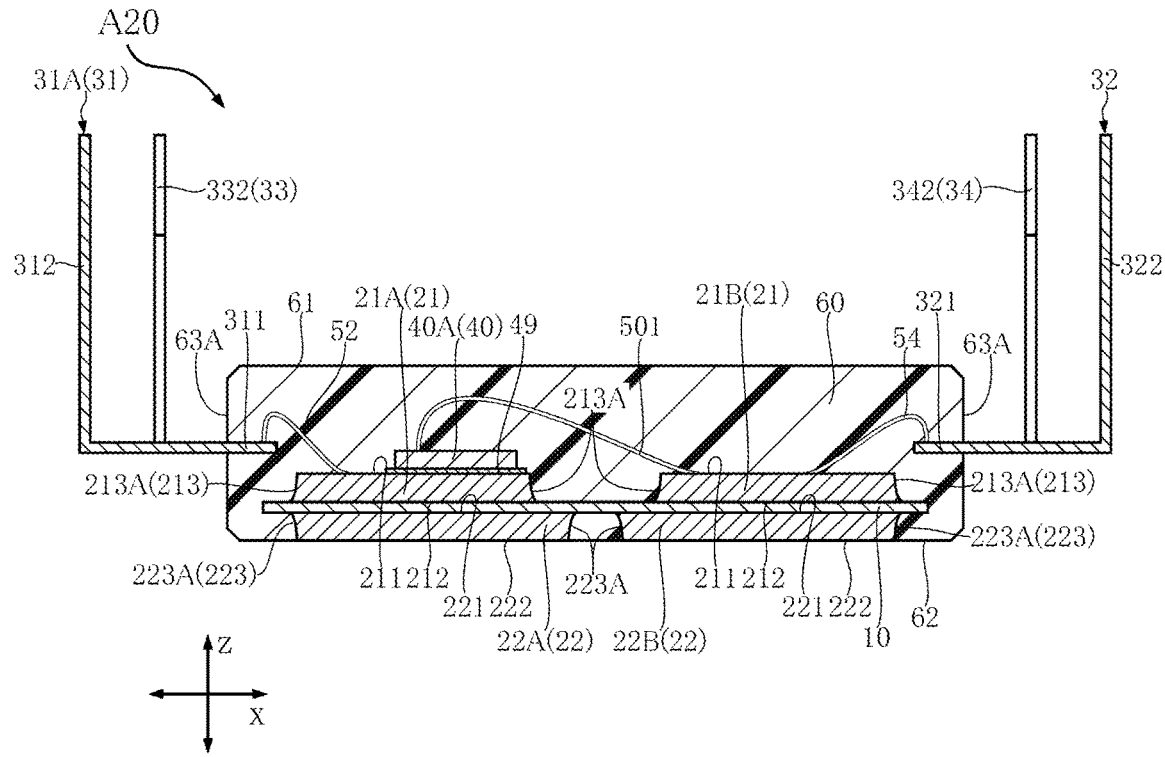
FIG. 19 is a cross-sectional view taken along a line XIX-XIX in FIG. 17.
Figure 20:
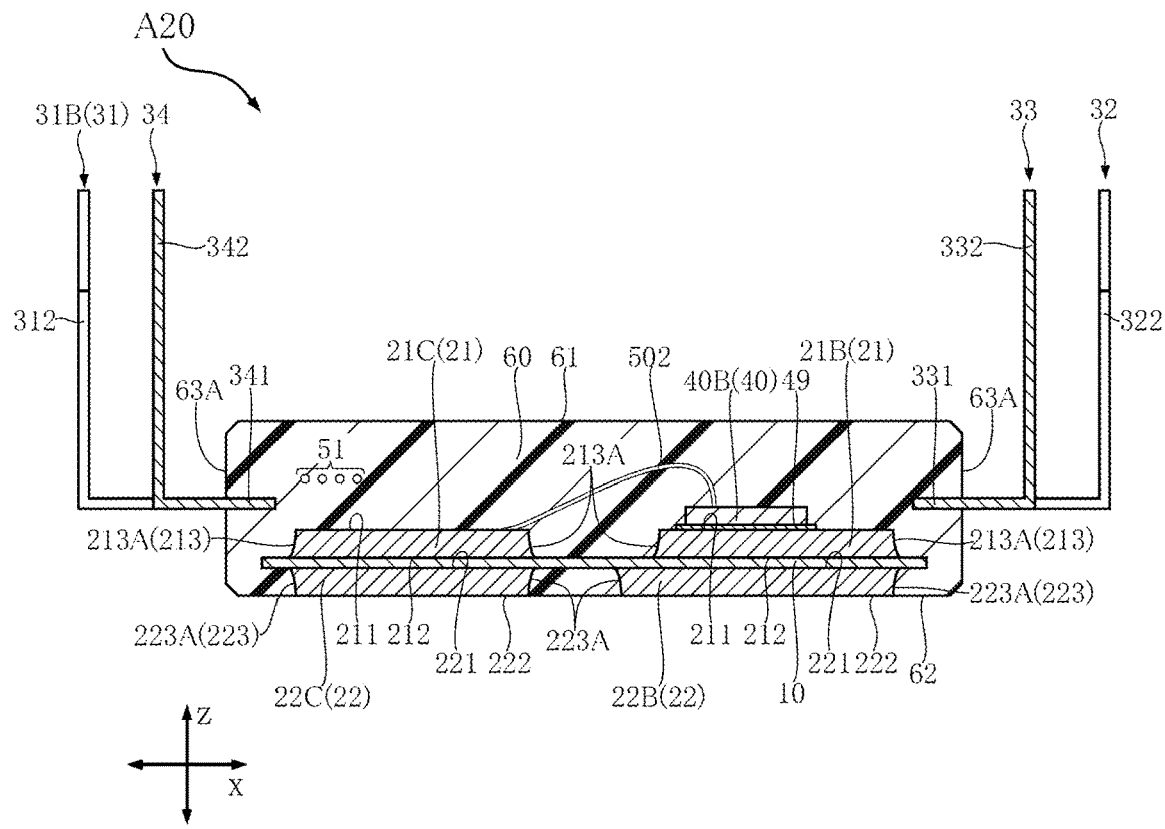
FIG. 20 is a cross-sectional view taken along a line XX-XX in FIG. 17.
Figure 23:
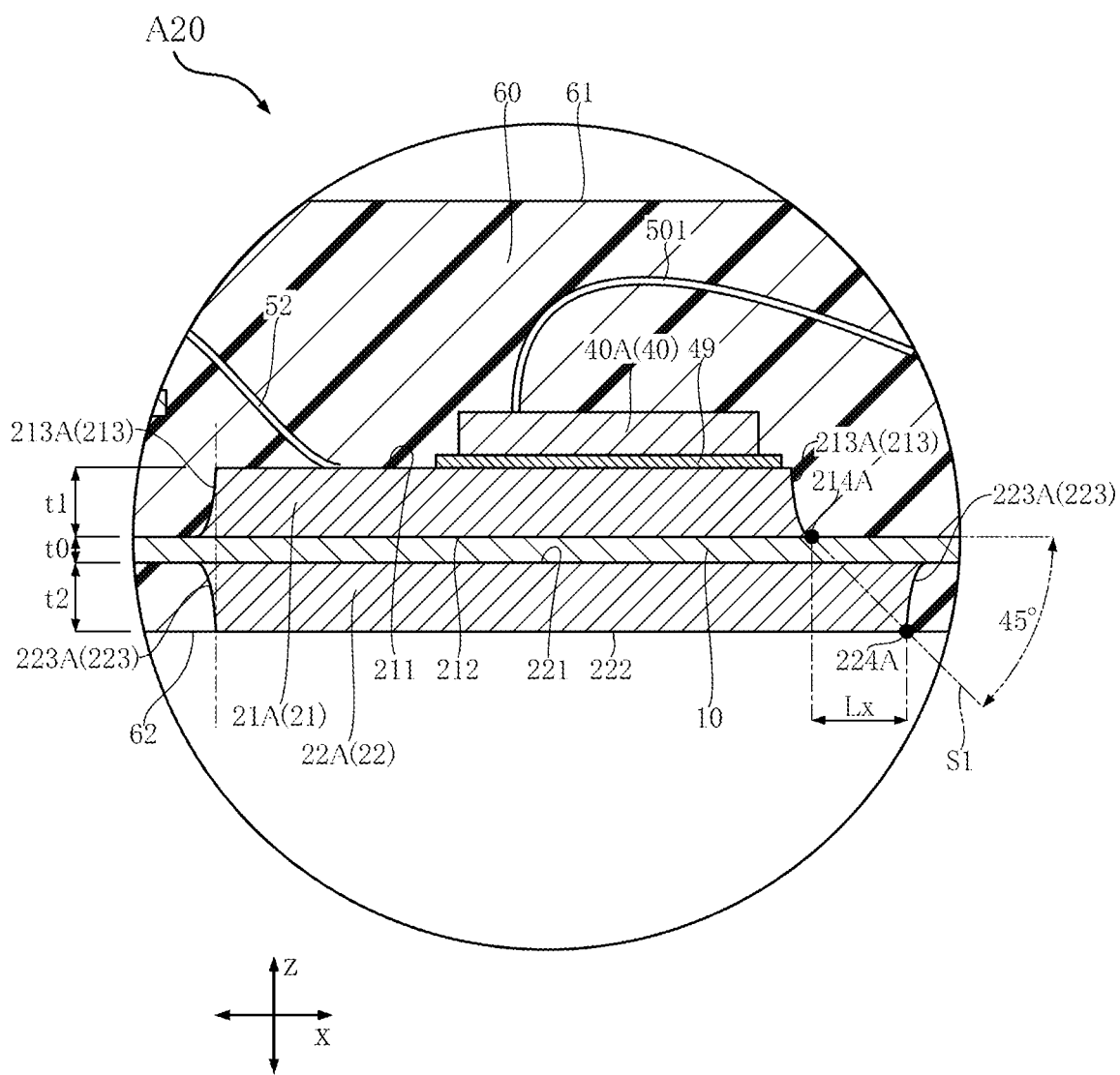
FIG. 23 is a partially enlarged view of FIG. 19.

As shown in FIG. 19 and FIG. 20, in the pair of first wiring layers 21A and the pair of second wiring layers 21B, and the pair of first heat dissipation layers 22A and the pair of second heat dissipation layers 22B, respectively corresponding to each other, at least one of the pair of second faces 223A in the plurality of second end faces 223 is located on the outer side, with respect to at least one of the pair of first faces 213A in the plurality of first end faces 213. In the semiconductor device A20, as shown in FIG. 23, one of the pair of second faces 223A is located at the same position as one of the pair of first faces 213A closest to the mentioned second face 223A, as viewed in the thickness direction z. In addition, the other of the pair of second faces 223A is located on the outer side with respect to one of the pair of first faces 213A closest to the mentioned second face 223A.

A minimum distance Lx in the first direction x shown in FIG. 23, between one of the pair of first faces 213A and one of the pair of second faces 223A, located on the outer side of the first face 213A, is defined as follows. The minimum distance Lx is equal to or longer than the sum of the thickness t0 of the insulating substrate 10, and the thickness t2 of one of the plurality of heat dissipation layers 22 that includes the pair of second faces 223A, which can be expressed as Lx≥t0+t2. Here, the minimum distance Lx corresponds to the distance in the first direction x between a boundary 214A between one of the pair of first faces 213A and the first reverse face 212, and a boundary 224A between one of the pair of second faces 223A, located on the outer side with respect to the mentioned first face 213A, and the second reverse face 222. Accordingly, with respect to an inclined plane S1, extending obliquely downward from the boundary 214A at 45° to the first reverse face 212, the boundary 224A either passes the inclined plane S1 in its entirety, or is located on the outer side with respect to the inclined plane S1.

Figure 21:
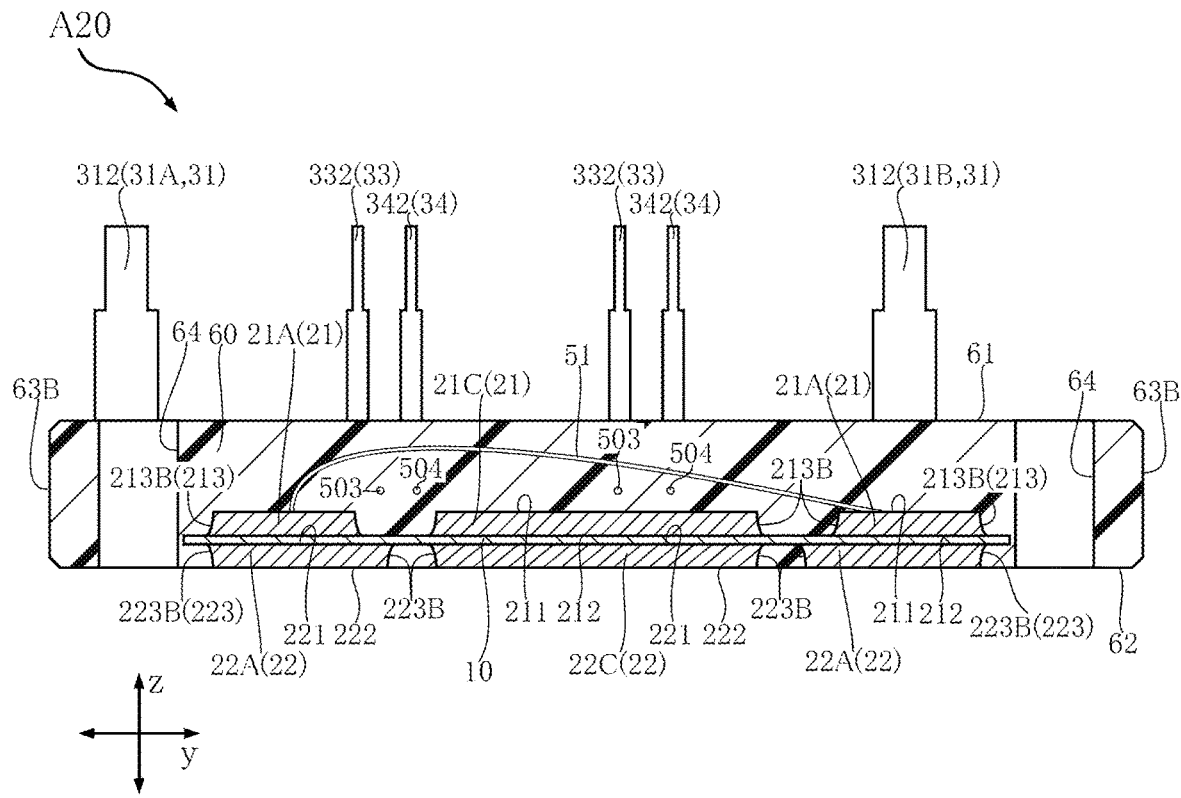
FIG. 21 is a cross-sectional view taken along a line XXI-XXI in FIG. 17.
Figure 22:
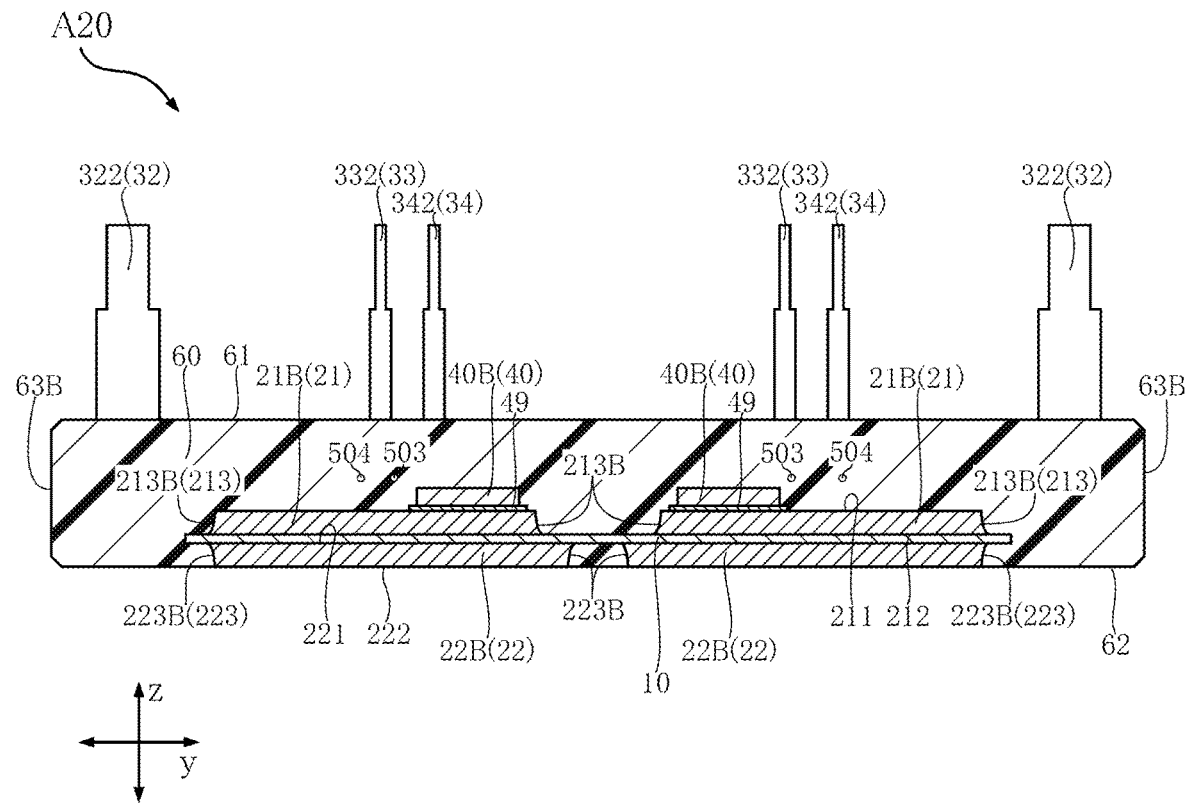
FIG. 22 is a cross-sectional view taken along a line XXII-XXII in FIG. 17.
Figure 24:
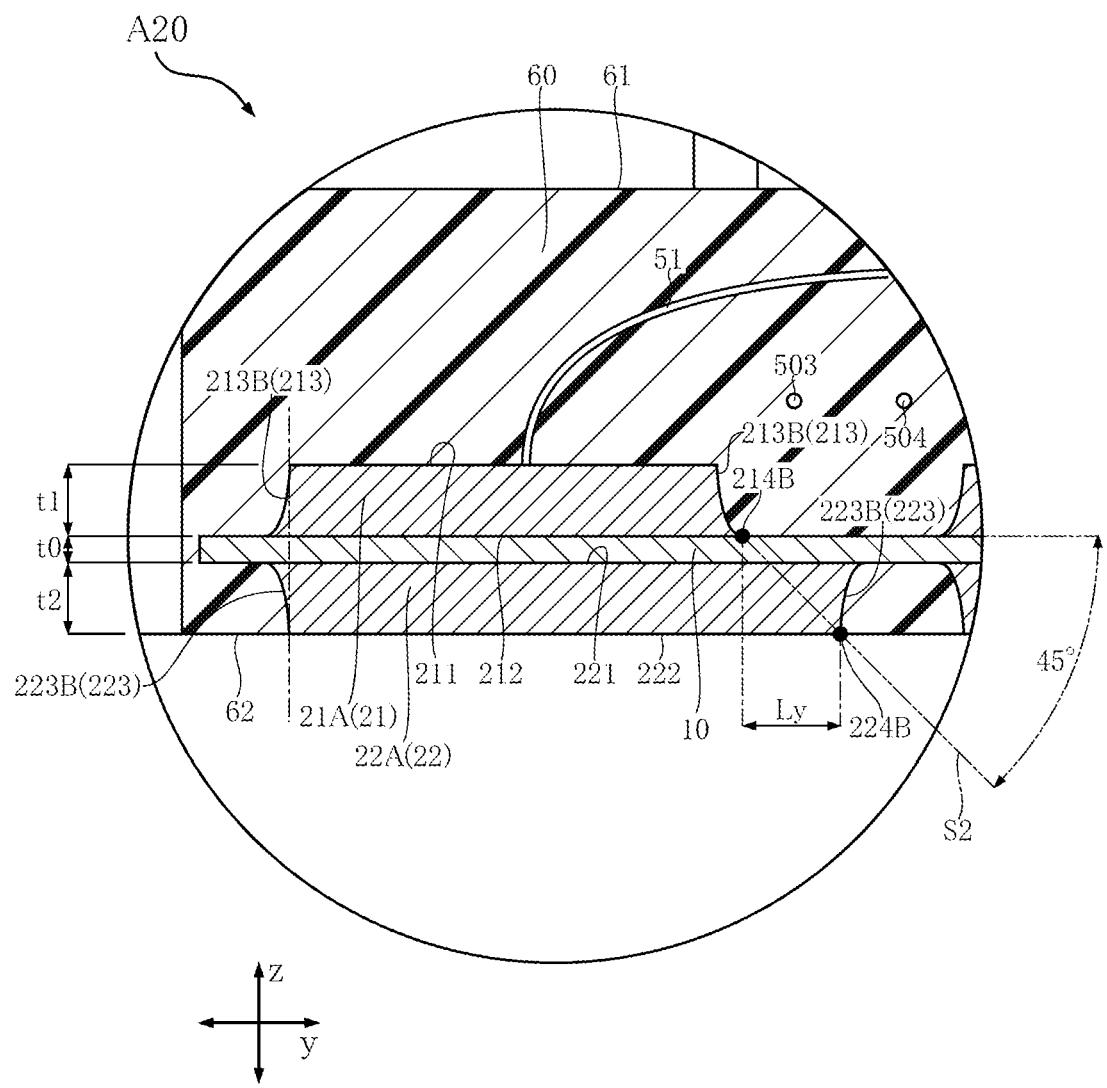
FIG. 24 is a partially enlarged view of FIG. 21.

As shown in FIG. 21 and FIG. 22, in the pair of first wiring layers 21A and the pair of second wiring layers 21B, and the pair of first heat dissipation layers 22A and the pair of second heat dissipation layers 22B, respectively corresponding to each other, at least one of the pair of fourth faces 223B in the plurality of second end faces 223 is located on the outer side, with respect to at least one of the pair of third faces 213B in the plurality of first end faces 213. In the semiconductor device A20, as shown in FIG. 24, as viewed in the thickness direction z, one of the pair of fourth faces 223B is located at the same position as one of the pair of third faces 213B closest to the mentioned fourth faces 223B. In addition, the other of the pair of fourth faces 223B is located on the outer side with respect to one of the pair of third faces 213B closest to the mentioned fourth face 223B.

A minimum distance Ly in the second direction y shown in FIG. 24, between one of the pair of third faces 213B and one of the pair of fourth faces 223B located on the outer side of the third face 213B, is defined as follows. The minimum distance Ly is equal to or longer than the sum of the thickness t0 of the insulating substrate 10, and the thickness t2 of one of the plurality of heat dissipation layers 22 that includes the pair of fourth faces 223B, which can be expressed as Ly≥t0+t2. Here, the minimum distance Ly corresponds to the distance in the second direction y between a boundary 214B between one of the pair of third faces 213B and the first reverse face 212, and a boundary 224B between one of the pair of fourth faces 223B, located on the outer side with respect to the mentioned third face 213B, and the second reverse face 222. Accordingly, with respect to an inclined plane S2, extending obliquely downward from the boundary 214B at 45° to the first reverse face 212, the boundary 224B either passes the inclined plane S2 in its entirety, or is located on the outer side with respect to the inclined plane S2.

The semiconductor device A20 provides the following advantageous effects.

The semiconductor device A20 includes the insulating substrate 10, the plurality of wiring layers 21 having the first reverse face 212 bonded to the insulating substrate 10, the plurality of heat dissipation layers 22 having the second obverse face 221 bonded to the insulating substrate 10, and the semiconductor elements 40 each bonded to the first obverse face 211 of one of the plurality of wiring layers 21. As viewed in the thickness direction z, the plurality of wiring layers 21 respectively overlap with the plurality of heat dissipation layers 22. Therefore, the semiconductor device A20 is also capable of suppressing the distortion of the insulating substrate 10, without compromising the heat dissipation performance.

The first end faces 213 of the plurality of wiring layers 21 include the pair of first faces 213A, spaced apart from each other in the first direction x. The second end faces 223 of the plurality of heat dissipation layers 22 include the pair of second faces 223A, spaced apart from each other in the first direction x. In the semiconductor device A20, as viewed in the thickness direction z, one of the pair of second faces 223A is located at the same position as one of the pair of first faces 213A closest to the mentioned second face 223A. In addition, the other of the pair of second faces 223A is located on the outer side with respect to one of the pair of first faces 213A closest to the mentioned second face 223A.

Referring now to FIG. 23, as viewed in the second direction y, heat transmitted from the plurality of wiring layers 21 to the second obverse face 221 of the plurality of heat dissipation layers 22, via the insulating substrate 10, is diffused inside the plurality of heat dissipation layers 22, generally along the inclined plane S1. In the semiconductor device A20, the minimum distance Lx in the first direction x, between one of the pair of first faces 213A closest to the other second face 223A, and the other second face 223A located on the outer side of the first face 213A, is equal to or longer than the sum of the thickness t0 of the insulating substrate 10 and the thickness t2 of one of the plurality of heat dissipation layers 22 that includes the pair of second faces 223A. Such a configuration contributes to more effectively reducing the heat resistance of the plurality of heat dissipation layers 22 in the first direction x.

The first end faces 213 of the plurality of wiring layers 21 include the pair of third faces 213B, spaced apart from each other in the second direction y. The second end faces 223 of the plurality of heat dissipation layers 22 include the pair of fourth faces 223B, spaced apart from each other in the second direction y. In the semiconductor device A20, as viewed in the thickness direction z, one of the pair of fourth faces 223B is located at the same position as one of the pair of third faces 213B closest to the mentioned fourth face 223B. In addition, the other of the pair of fourth faces 223B is located on the outer side with respect to one of the pair of third faces 213B closest to the mentioned fourth face 223B.

Referring now to FIG. 24, as viewed in the first direction x, heat transmitted from the plurality of wiring layers 21 to the second obverse face 221 of the plurality of heat dissipation layers 22, via the insulating substrate 10, is diffused inside the plurality of heat dissipation layers 22, generally along the inclined plane S2. In the semiconductor device A20, the minimum distance Ly in the second direction y, between one of the pair of third faces 213B closest to the other fourth face 223B, and the other fourth face 223B located on the outer side of the third face 213B, is equal to or longer than the sum of the thickness t0 of the insulating substrate 10 and the thickness t2 of one of the plurality of heat dissipation layers 22 that includes the pair of fourth faces 223B. Such a configuration contributes to more effectively reducing the heat resistance of the plurality of heat dissipation layers 22 in the second direction y.

Third Embodiment

Figure 25:
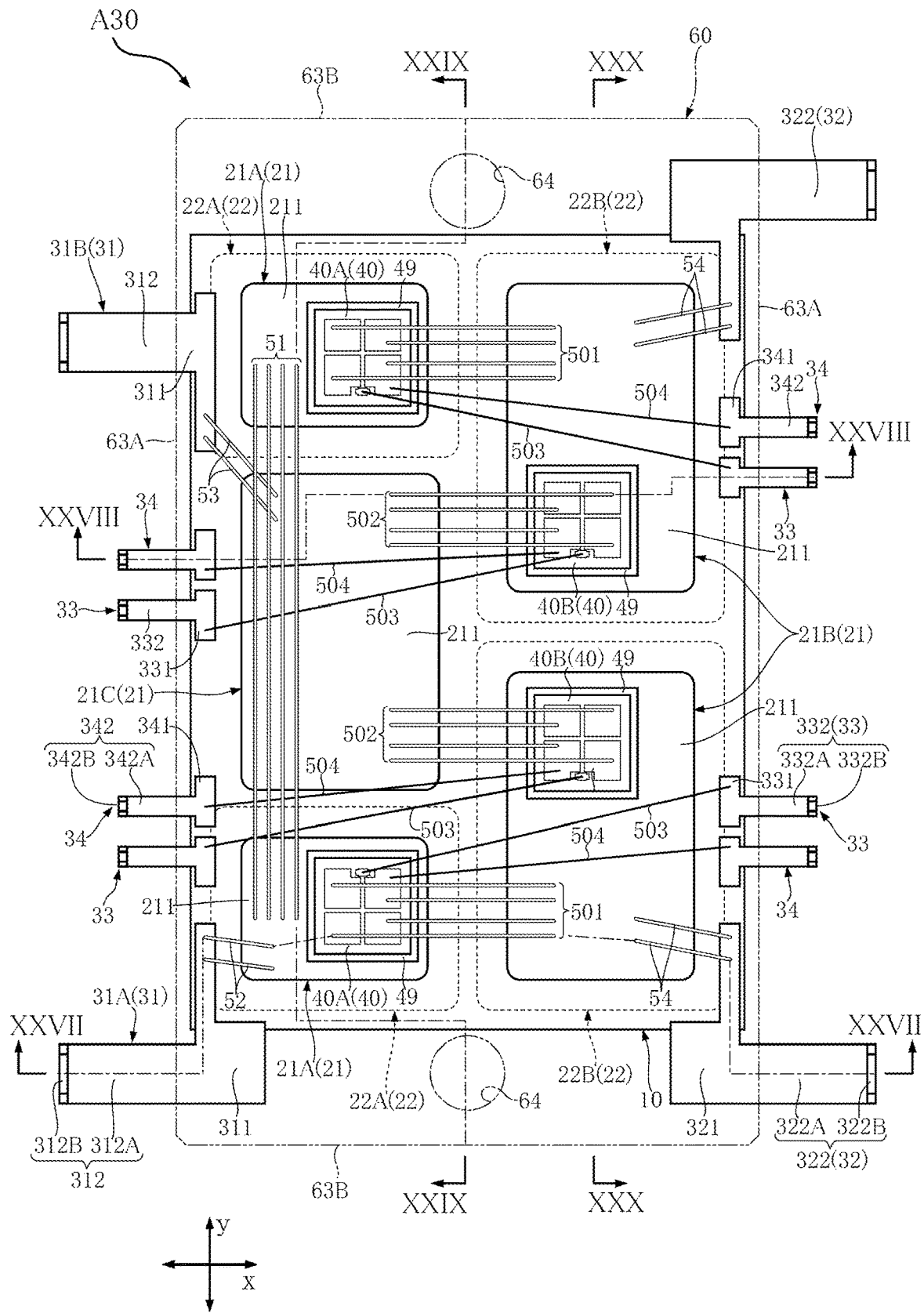
FIG. 25 is a plan view of a semiconductor device according to a third embodiment of the present disclosure, seen through the sealing resin.
Figure 26:
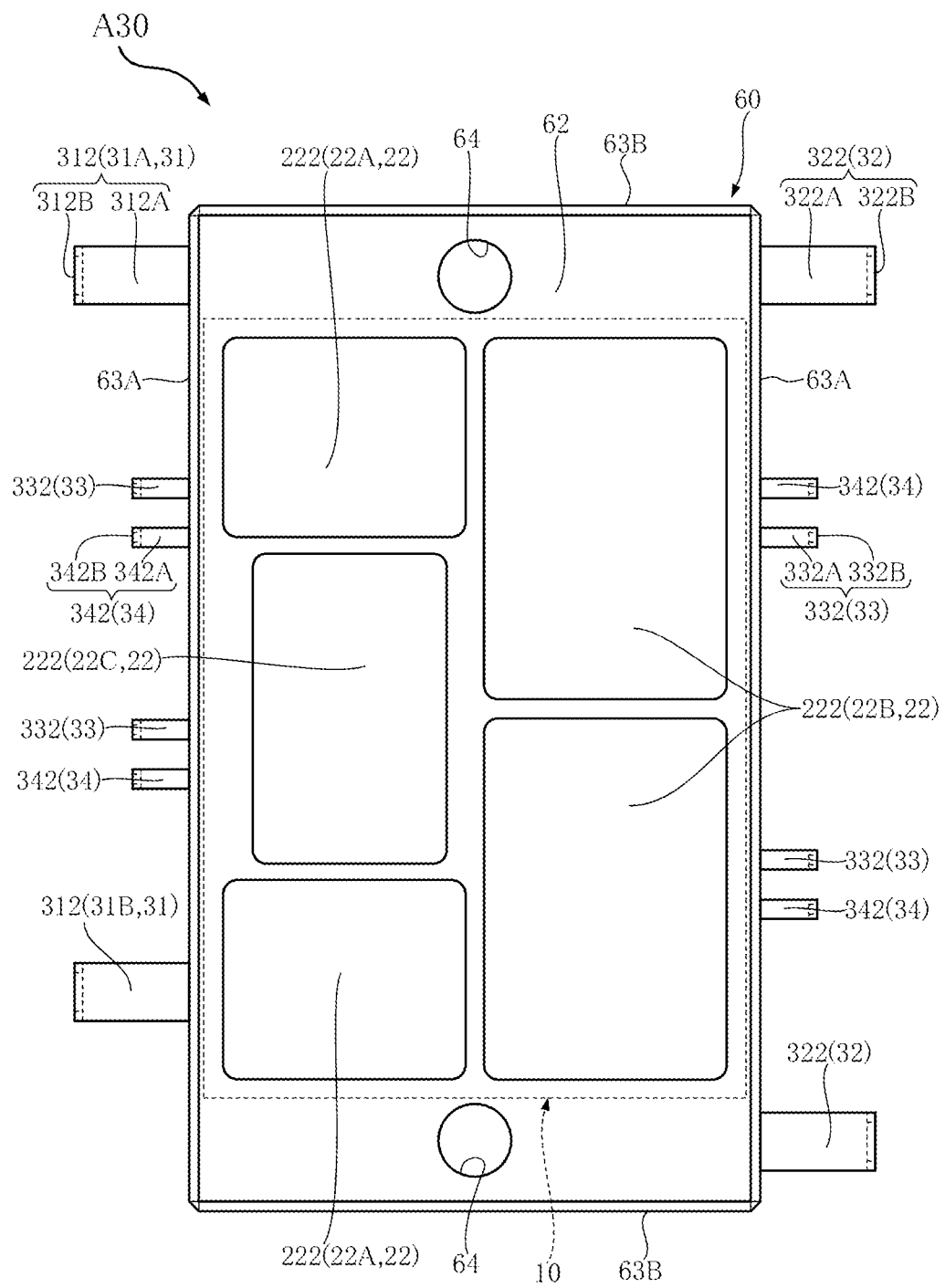
FIG. 26 is a bottom view of the semiconductor device shown in FIG. 25.

Referring to FIG. 25 to FIG. 32, a semiconductor device A30 according to a third embodiment of the present disclosure will be described hereunder. In these drawings, the elements same as or similar to those of the foregoing semiconductor device A10 are given the same numeral, and the description thereof will not be repeated. In FIG. 25 the sealing resin 60 is seen through, for the sake of clarity. The sealing resin 60 seen through is indicated by an [0082]

The semiconductor device A30 is different from the semiconductor device A10, in the configuration of the plurality of wiring layers 21 and the plurality of heat dissipation layers 22.

As shown in FIG. 27 to FIG. 30, at least one of the plurality of second end faces 223 of the plurality of heat dissipation layers 22 is located on the outer side, with respect to at least one of the plurality of first end faces 213 of the plurality of wiring layers 21. In the example represented by the semiconductor device A30, the respective second end faces 223 of the pair of first heat dissipation layers 22A and the pair of second heat dissipation layers 22B are all located on the outer side, with respect to the corresponding first end faces 213 of the pair of first wiring layers 21A and the pair of second wiring layers 21B. Here, the plurality of semiconductor elements 40 are respectively bonded to the pair of first wiring layers 21A and the pair of second wiring layers 21B.

Figure 27:
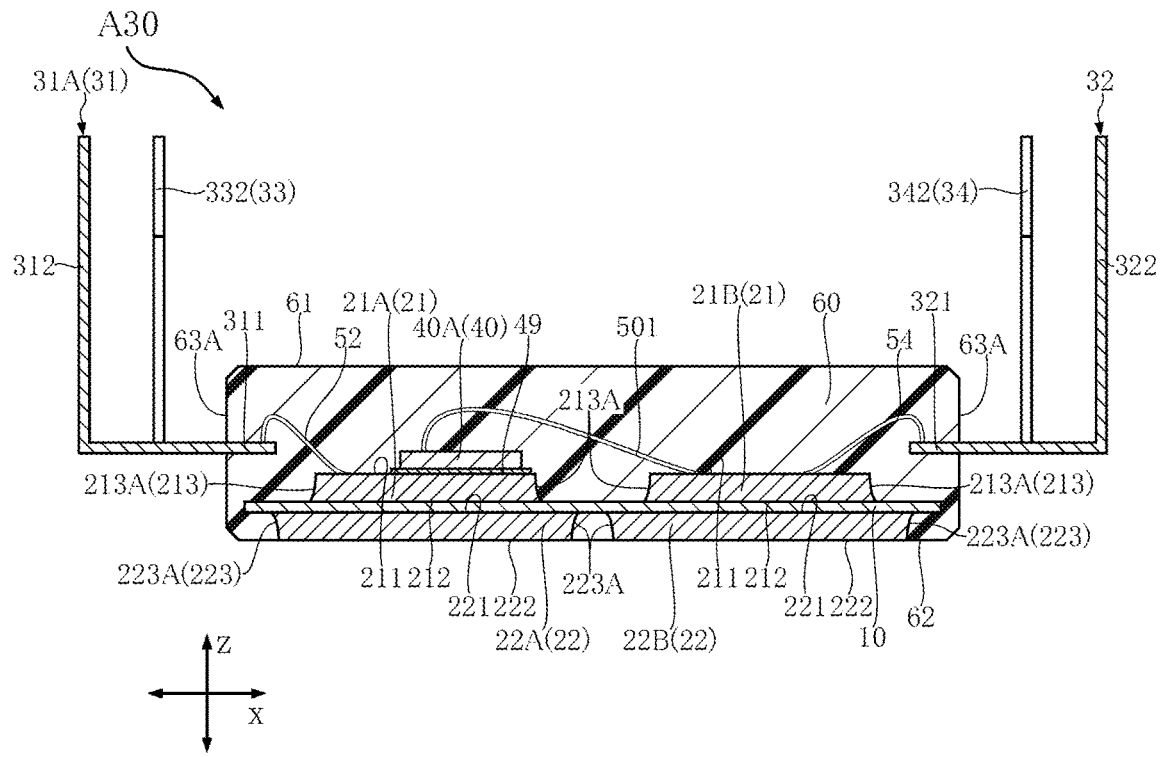
FIG. 27 is a cross-sectional view taken along a line XXVII-XXVII in FIG. 25.
Figure 28:
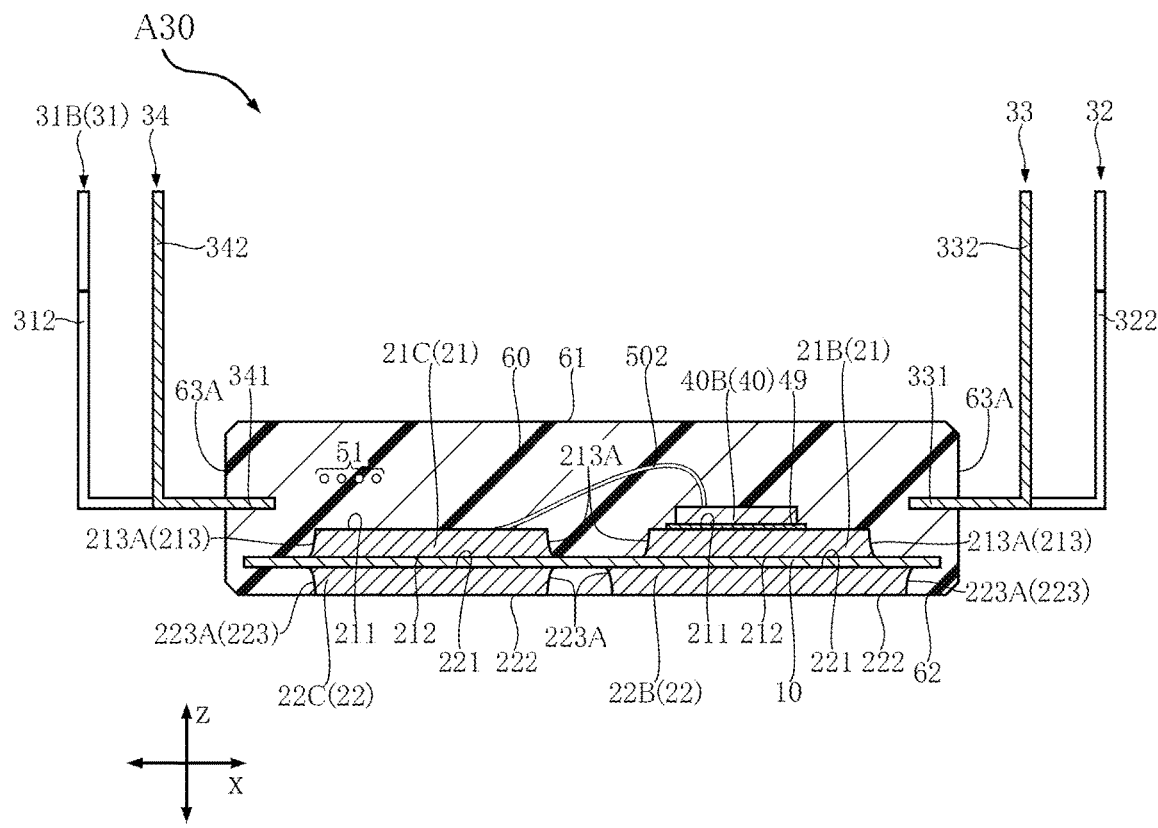
FIG. 28 is a cross-sectional view taken along a line XXVIII-XXVIII in FIG. 25.

As shown in FIG. 27 and FIG. 28, in the pair of first wiring layers 21A and the pair of second wiring layers 21B, and the pair of first heat dissipation layers 22A and the pair of second heat dissipation layers 22B, respectively corresponding to each other, the pair of second faces 223A in the plurality of second end faces 223 are located on the outer side, with respect to the pair of first faces 213A in the plurality of first end faces 213.

The minimum distance Lx in the first direction x shown in FIG. 31, between each of the pair of first faces 213A and the corresponding pair of second faces 223A, located on the outer side of the first face 213A, is defined as follows. The minimum distance Lx is equal to or longer than the sum of the thickness t0 of the insulating substrate 10, and the thickness t2 of one of the plurality of heat dissipation layers 22 that includes the pair of second faces 223A, which can be expressed as Lx≥t0+t2. Here, the minimum distance Lx corresponds to the distance in the first direction x between the boundary 214A between each of the pair of first faces 213A and the first reverse face 212, and the boundary 224A between each of the pair of second faces 223A and the second reverse face 222. Accordingly, with respect to the inclined plane S1, extending obliquely downward from the boundary 214A at 45° to the first reverse face 212, the boundary 224A either passes the inclined plane S1 in its entirety, or is located on the outer side with respect to the inclined plane S1.

Figure 29:
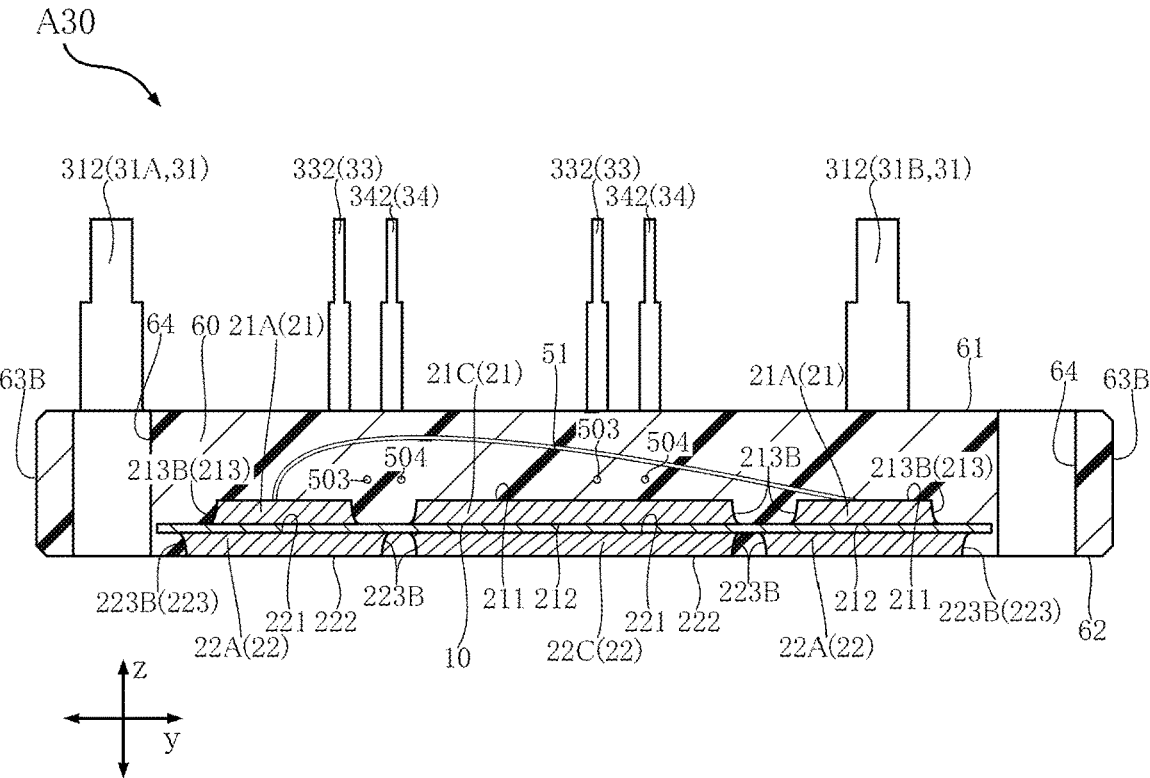
FIG. 29 is a cross-sectional view taken along a line XXIX-XXIX in FIG. 25.
Figure 30:
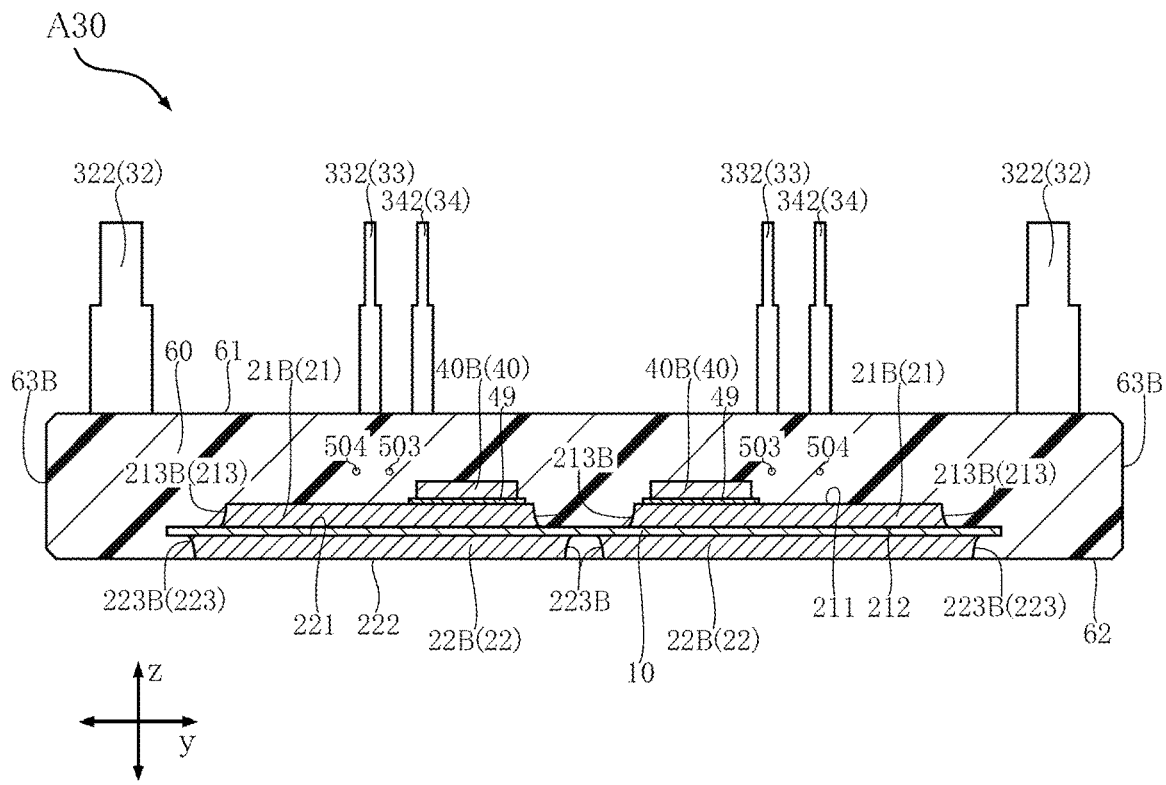
FIG. 30 is a cross-sectional view taken along a line XXX-XXX in FIG. 25.

As shown in FIG. 29 and FIG. 30, in the pair of first wiring layers 21A and the pair of second wiring layers 21B, and the pair of first heat dissipation layers 22A and the pair of second heat dissipation layers 22B, respectively corresponding to each other, the pair of fourth faces 223B in the plurality of second end faces 223 are located on the outer side, with respect to the pair of third faces 213B in the plurality of first end faces 213.

The minimum distance Ly in the second direction y shown in FIG. 32, between each of the pair of third faces 213B and the corresponding pair of fourth faces 223B located on the outer side of the third face 213B, is defined as follows. The minimum distance Ly is equal to or longer than the sum of the thickness t0 of the insulating substrate 10, and the thickness t2 of one of the plurality of heat dissipation layers 22 that includes the pair of fourth faces 223B, which can be expressed as Ly≥t0+t2. Here, the minimum distance Ly corresponds to the distance in the second direction y between the boundary 214B between each of the pair of third faces 213B and the first reverse face 212, and the boundary 224B between each of the pair of fourth faces 223B and the second reverse face 222. Accordingly, with respect to the inclined plane S2, extending obliquely downward from the boundary 214B at 45° to the first reverse face 212, the boundary 224B either passes the inclined plane S2 in its entirety, or is located on the outer side with respect to the inclined plane S2.

The semiconductor device A30 provides the following advantageous effects.

The semiconductor device A30 includes the insulating substrate 10, the plurality of wiring layers 21 having the first reverse face 212 bonded to the insulating substrate 10, the plurality of heat dissipation layers 22 having the second obverse face 221 bonded to the insulating substrate 10, and the semiconductor elements 40 each bonded to the first obverse face 211 of one of the plurality of wiring layers 21. As viewed in the thickness direction z, the plurality of wiring layers 21 respectively overlap with the plurality of heat dissipation layers 22. Therefore, the semiconductor device A30 is also capable of suppressing the distortion of the insulating substrate 10, without compromising the heat dissipation performance.

The first end faces 213 of the plurality of wiring layers 21 include the pair of first faces 213A, spaced apart from each other in the first direction x. The second end faces 223 of the plurality of heat dissipation layers 22 include the pair of second faces 223A, spaced apart from each other in the first direction x. In the semiconductor device A30, the pair of second faces 223A are located on the outer side with respect to the pair of first faces 213A.

Figure 31:
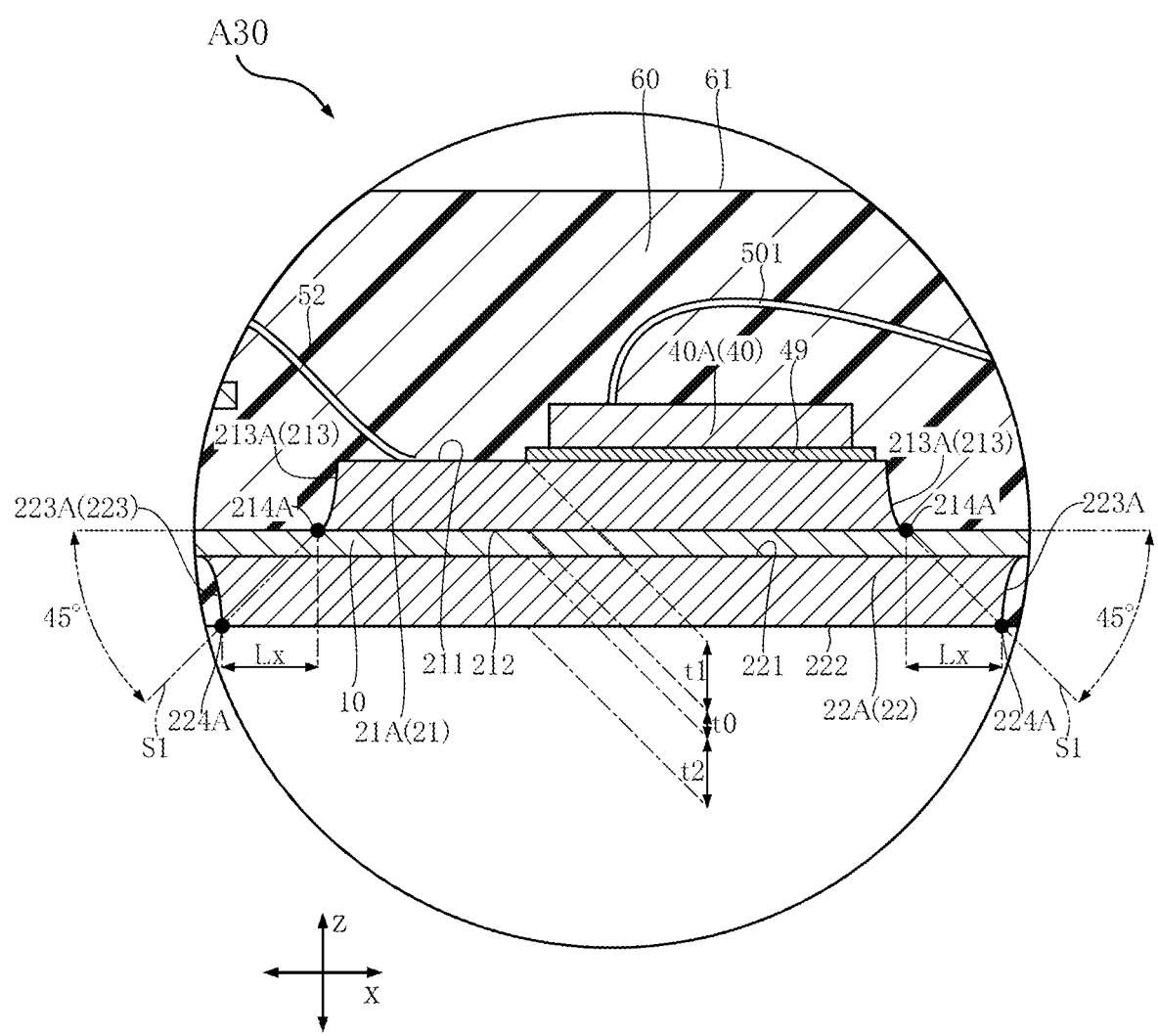
FIG. 31 is a partially enlarged view of FIG. 27.

Referring now to FIG. 31, as viewed in the second direction y, heat transmitted from the plurality of wiring layers 21 to the second obverse face 221 of the plurality of heat dissipation layers 22, via the insulating substrate 10, is diffused inside the plurality of heat dissipation layers 22, generally along the inclined plane S1. In the semiconductor device A30, the minimum distance Lx in the first direction x, between each of the pair of first faces 213A and the corresponding pair of second faces 223A located on the outer side of the first face 213A, is equal to or longer than the sum of the thickness t0 of the insulating substrate 10 and the thickness t2 of one of the plurality of heat dissipation layers that includes the pair of second faces 223A. Such a configuration contributes to more effectively reducing the heat resistance of the plurality of heat dissipation layers 22 in the first direction x, compared with the semiconductor device A20.

The first end faces 213 of the plurality of wiring layers 21 include the pair of third faces 213B, spaced apart from each other in the second direction y. The second end faces 223 of the plurality of heat dissipation layers 22 include the pair of fourth faces 223B, spaced apart from each other in the second direction y. In the semiconductor device A30, the pair of fourth faces 223B are located on the outer side with respect to the pair of third faces 213B.

Figure 32:
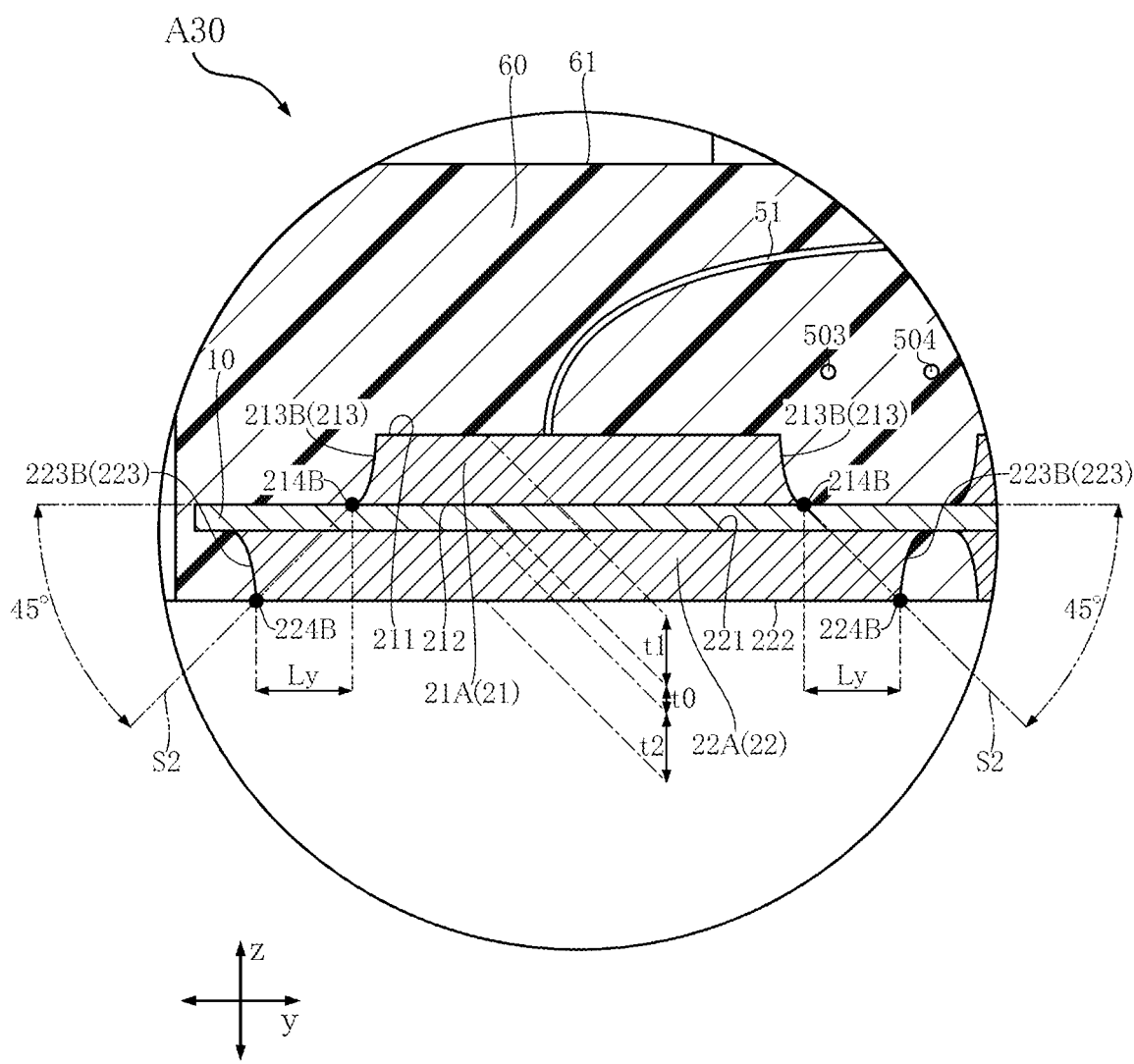
FIG. 32 is a partially enlarged view of FIG. 29.

Referring now to FIG. 32, as viewed in the first direction x, heat transmitted from the plurality of wiring layers 21 to the second obverse face 221 of the plurality of heat dissipation layers 22, via the insulating substrate 10, is diffused inside the plurality of heat dissipation layers 22, generally along the inclined plane S2. In the semiconductor device A30, the minimum distance Ly in the second direction y, between each of the pair of third faces 213B and the corresponding pair of fourth faces 223B located on the outer side of the third face 213B, is equal to or longer than the sum of the thickness t0 of the insulating substrate 10 and the thickness t2 of one of the plurality of heat dissipation layers 22 that includes the pair of fourth faces 223B. Such a configuration contributes to more effectively reducing the heat resistance of the plurality of heat dissipation layers 22 in the second direction y, compared with the semiconductor device A20.

The present disclosure is not limited to the foregoing embodiments. The specific configuration of the elements of the semiconductor device according to the present disclosure may be modified in various manners.

REFERENCE SIGNS LIST

The embodiments of the present disclosure can be defined as the following appendices.

Appendix 1

A semiconductor device comprising:
an insulating substrate;
a plurality of wiring layers each having a first obverse face and a first reverse face oriented in opposite directions to each other in a thickness direction, the first reverse face being connected to the insulating substrate;
a plurality of heat dissipation layers each having a second obverse face oriented in a same direction as the first obverse face, and a second reverse face oriented in an opposite direction to the second obverse face in the thickness direction, and each being located opposite to the plurality of wiring layers in the thickness direction with respect to the insulating substrate, the second obverse face being connected to the insulating substrate;
a semiconductor element connected to one of the first obverse faces of the plurality of wiring layers; and
a sealing resin covering the insulating substrate, the plurality of wiring layers, and the semiconductor element,
wherein as viewed in the thickness direction, the plurality of wiring layers overlap with the plurality of heat dissipation layers, respectively.

Appendix 2

The semiconductor device according to appendix 1, wherein each of the plurality of wiring layers is thicker than the insulating substrate.

Appendix 3

The semiconductor device according to appendix 2, wherein each of the plurality of heat dissipation layers is thicker than the insulating substrate.

Appendix 4

The semiconductor device according to appendix 2 or 3, wherein each of the plurality of wiring layers and a corresponding one of the plurality of heat dissipation layers overlapping with said each of the plurality of wiring layers other have a same shape as viewed in the thickness direction.

Appendix 5

The semiconductor device according to appendix 4, wherein the plurality of wiring layers each include a plurality of first end faces connected to the first obverse face and the first reverse face,
the plurality of heat dissipation layers each include a plurality of second end faces connected to the second obverse face and the second reverse face, and
the plurality of second end faces are each located at a same position as a corresponding one of the plurality of first end faces, as viewed in the thickness direction.

Appendix 6

The semiconductor device according to appendix 4,
in which the plurality of wiring layers each include a plurality of first end faces connected to both of the first obverse face and the first reverse face,
the plurality of heat dissipation layers each include a plurality of second end faces connected to both of the second obverse face and the second reverse face, and
at least one of the plurality of second end faces is located on an outer side, with respect to at least one of the plurality of first end faces.

Appendix 7

The semiconductor device according to appendix 6,
in which the plurality of first end faces include a pair of first faces spaced apart from each other in a first direction orthogonal to the thickness direction,
the plurality of second end faces include a pair of second faces spaced apart from each other in the first direction, and
at least one of the pair of second faces is located on an outer side, with respect to at least one of the pair of first faces.

Appendix 8

The semiconductor device according to appendix 7, wherein a minimum distance in the first direction between one of the pair of first faces and one of the pair of second faces located on an outer side with respect to the first face is equal to or longer than a sum of a thickness of the insulating substrate and a thickness of one of the plurality of heat dissipation layers that includes the pair of second faces.

Appendix 9

The semiconductor device according to appendix 8, wherein as viewed in the thickness direction, one of the pair of second faces is located at a same position as one of the pair of first faces closest to the second face, and
the other of the pair of second faces is located on an outer side with respect to one of the pair of first faces closest to the second face.

Appendix 10

The semiconductor device according to appendix 8, wherein the pair of second faces are located on an outer side with respect to the pair of first faces.

Appendix 11

The semiconductor device according to any one of appendices 7 to 10, wherein the plurality of first end faces include a pair of third faces spaced apart from each other in a second direction orthogonal to both of the thickness direction and the first direction,
the plurality of second end faces include a pair of fourth faces spaced apart from each other in the second direction, and
at least one of the pair of fourth faces is located on an outer side, with respect to at least one of the pair of third faces.

Appendix 12

The semiconductor device according to appendix 11, wherein a minimum distance in the second direction between one of the pair of third faces and one of the pair of fourth faces located on an outer side with respect to the third face is equal to or longer than a sum of the thickness of the insulating substrate and a thickness of one of the plurality of heat dissipation layers that includes the pair of fourth faces.

Appendix 13

The semiconductor device according to appendix 12, wherein as viewed in the thickness direction, one of the pair of fourth faces is located at a same position as one of the pair of third faces closest to the fourth face, and the other of the pair of fourth faces is located on an outer side, with respect to one of the pair of third faces closest to the fourth face.

Appendix 14

The semiconductor device according to appendix 12, wherein the pair of fourth faces are located on an outer side with respect to the pair of third faces.

Appendix 15

The semiconductor device according to any one of appendices 1 to 14, wherein a part of the plurality of heat dissipation layers is covered with the sealing resin, and the respective second reverse faces of the plurality of heat dissipation layers are exposed from the sealing resin.

Appendix 16

The semiconductor device according to appendix 15, wherein as viewed in the thickness direction, the plurality of wiring layers and the plurality of heat dissipation layers are both located on an inner side, with respect to a peripheral edge of the insulating substrate.

Appendix 17

The semiconductor device according to any one of appendices 1 to 16, further comprising a joint layer opposite to the plurality of wiring layers in the thickness direction with respect to the insulating substrate, wherein the joint layer is bonded to the insulating substrate, and connecting at least two of the plurality of heat dissipation layers to each other.

The invention claimed is:

1. A semiconductor device comprising:
an insulating substrate;
a plurality of wiring layers each having a first obverse face and a first reverse face oriented in opposite directions to each other in a thickness direction, the first reverse face being connected to the insulating substrate;
a plurality of heat dissipation layers each having a second obverse face oriented in a same direction as the first obverse face, and a second reverse face oriented in an opposite direction to the second obverse face in the thickness direction, and each being located opposite to the plurality of wiring layers in the thickness direction with respect to the insulating substrate, the second obverse face being connected to the insulating substrate;
a semiconductor element connected to one of the first obverse faces of the plurality of wiring layers;
a sealing resin covering the insulating substrate, the plurality of wiring layers, and the semiconductor element; and
a joint layer located on an opposite side of the plurality of wiring layers in the thickness direction, with respect to the insulating substrate,
wherein as viewed in the thickness direction, the plurality of wiring layers overlap with the plurality of heat dissipation layers, respectively, and
the joint layer is bonded to the insulating substrate and connecting at least two of the plurality of heat dissipation layers to each other.

2. The semiconductor device according to claim 1, wherein each of the plurality of wiring layers is thicker than the insulating substrate.

3. The semiconductor device according to claim 2, wherein each of the plurality of heat dissipation layers is thicker than the insulating substrate.

4. The semiconductor device according to claim 2, wherein each of the plurality of wiring layers and a corresponding one of the plurality of heat dissipation layers overlapping with said each of the plurality of wiring layers have a same shape as viewed in the thickness direction.

5. The semiconductor device according to claim 4, wherein the plurality of wiring layers each include a plurality of first end faces connected to the first obverse face and the first reverse face, the plurality of heat dissipation layers each include a plurality of second end faces connected to the second obverse face and the second reverse face, and
the plurality of second end faces are each located at a same position as a corresponding one of the plurality of first end faces, as viewed in the thickness direction.

6. The semiconductor device according to claim 4, wherein the plurality of wiring layers each include a plurality of first end faces connected to both of the first obverse face and the first reverse face, the plurality of heat dissipation layers each include a plurality of second end faces connected to both of the second obverse face and the second reverse face, and
at least one of the plurality of second end faces is located on an outer side with respect to at least one of the plurality of first end faces.

7. The semiconductor device according to claim 6, wherein the plurality of first end faces include a pair of first faces spaced apart from each other in a first direction orthogonal to the thickness direction, the plurality of second end faces include a pair of second faces spaced apart from each other in the first direction, and
at least one of the pair of second faces is located on an outer side, with respect to at least one of the pair of first faces.

8. The semiconductor device according to claim 7, wherein a minimum distance in the first direction, between one of the pair of first faces and one of the pair of second faces located on an outer side with respect to the first face, is equal to or longer than a sum of a thickness of the insulating substrate and a thickness of one of the plurality of heat dissipation layers that includes the pair of second faces.

9. The semiconductor device according to claim 8, wherein, as viewed in the thickness direction, one of the pair of second faces is located at a same position as one of the pair of first faces closest to the second face, and the other of the pair of second faces is located on an outer side with respect to one of the pair of first faces closest to the second face.

10. The semiconductor device according to claim 8, wherein the pair of second faces are located on an outer side with respect to the pair of first faces.

11. The semiconductor device according to claim 7, wherein the plurality of first end faces include a pair of third faces spaced apart from each other in a second direction orthogonal to both of the thickness direction and the first direction, the plurality of second end faces include a pair of fourth faces spaced apart from each other in the second direction, and at least one of the pair of fourth faces is located on an outer side, with respect to at least one of the pair of third faces.

12. The semiconductor device according to claim 11, wherein a minimum distance in the second direction, between one of the pair of third faces and one of the pair of fourth faces located on an outer side with respect to the third face, is equal to or longer than a sum of the thickness of the insulating substrate and a thickness of one of the plurality of heat dissipation layers that includes the pair of fourth faces.

13. The semiconductor device according to claim 12, wherein as viewed in the thickness direction, one of the pair of fourth faces is located at a same position as one of the pair of third faces closest to the fourth face, and the other of the pair of fourth faces is located on an outer side, with respect to one of the pair of third faces closest to the fourth face.

14. The semiconductor device according to claim 12, wherein the pair of fourth faces are located on an outer side with respect to the pair of third faces.

15. The semiconductor device according to claim 1, wherein a part of the plurality of heat dissipation layers is covered with the sealing resin, and the respective second reverse faces of the plurality of heat dissipation layers are exposed from the sealing resin.

16. The semiconductor device according to claim 15, wherein, as viewed in the thickness direction, the plurality of wiring layers and the plurality of heat dissipation layers are both located on an inner side, with respect to a peripheral edge of the insulating substrate.

17. The semiconductor device according to claim 3, wherein a thickness of each of the plurality of wiring layers is 0.8 mm or thicker, and a thickness of each of the plurality of heat dissipation layers is 0.8 mm or thicker.

18. The semiconductor device according to claim 1, wherein the semiconductor element is a MOSFET composed of silicon carbonate or a Schottky barrier diode.

19. An electronic device comprising:

an insulating substrate;

a plurality of wiring layers each having a first obverse face and a first reverse face oriented in opposite directions to each other in a thickness direction, the first reverse face being connected to the insulating substrate;

a plurality of heat dissipation layers each having a second obverse face oriented in a same direction as the first obverse face, and a second reverse face oriented in an opposite direction to the second obverse face in the thickness direction, and each being located opposite to the plurality of wiring layers in the thickness direction with respect to the insulating substrate, the second obverse face being connected to the insulating substrate;

a semiconductor element connected to one of the first obverse faces of the plurality of wiring layers; and a sealing resin covering the insulating substrate, the plurality of wiring layers, and the semiconductor element, wherein the semiconductor element is composed of silicon carbonate, as viewed in the thickness direction, the plurality of wiring layers overlap with the plurality of heat dissipation layers, respectively, a thickness of each of the plurality of wiring layers and a thickness of each of the plurality of heat dissipation layers are thicker than the insulating substrate, the thickness of each of the plurality of wiring layers is 0.8 mm or thicker, and the thickness of each of the plurality of heat dissipation layers is 0.8 mm or thicker.

* * * * *